(12) United States Patent
Bae et al.

(10) Patent No.: US 12,324,090 B2
(45) Date of Patent: Jun. 3, 2025

(54) ELECTRONIC DEVICE COMPRISING ANTENNA MODULE AND COAXIAL CABLE

(71) Applicant: SAMSUNG ELECTRONICS CO., LTD., Suwon-si (KR)

(72) Inventors: Seungjae Bae, Suwon-si (KR);
Moohyun Baek, Suwon-si (KR);
Soonwoong Yang, Suwon-si (KR);
Changmin Lee, Suwon-si (KR);
Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 196 days.

(21) Appl. No.: 18/115,333

(22) Filed: Feb. 28, 2023

(65) Prior Publication Data
US 2023/0209701 A1 Jun. 29, 2023

Related U.S. Application Data

(63) Continuation of application No. PCT/KR2021/010752, filed on Aug. 12, 2021.

(30) Foreign Application Priority Data

Sep. 1, 2020 (KR) ........................ 10-2020-0111146

(51) Int. Cl.
*H05K 1/02* (2006.01)
*H05K 1/14* (2006.01)

(52) U.S. Cl.
CPC ........... *H05K 1/0243* (2013.01); *H05K 1/145* (2013.01); *H05K 1/147* (2013.01); *H05K 2201/10037* (2013.01); *H05K 2201/10098* (2013.01)

(58) Field of Classification Search
CPC .. H01Q 1/243; H05K 2201/05; H05K 7/1427; H05K 2201/10098;
(Continued)

(56) References Cited

U.S. PATENT DOCUMENTS

| 10,582,031 B2 | 3/2020 | Hu |
| 2014/0225806 A1 | 8/2014 | Lee et al. |

(Continued)

FOREIGN PATENT DOCUMENTS

| JP | 2001-53519 | 2/2001 |
| JP | 2007-135247 | 5/2007 |

(Continued)

OTHER PUBLICATIONS

International Search Report for PCT/KR2021/010752, mailed Dec. 10, 2021, 5 pages.
(Continued)

*Primary Examiner* — Monica C King
(74) *Attorney, Agent, or Firm* — Nixon & Vanderhye P.C.

(57) ABSTRACT

An electronic device may include: a housing forming at least a portion of the exterior of the electronic device; a first printed circuit board (PCB) disposed in a first region formed by the housing; a second printed circuit board disposed in a second region formed by the housing; a first antenna module disposed in a third region formed by the housing and adjacent to at least a portion of the exterior; a bracket which fixes the first antenna module to the housing; a flexible printed circuit board (FPCB) which electrically connects the first printed circuit board to the first antenna module; and at least one coaxial cable which electrically connects the first printed circuit board to the second printed circuit board, wherein the at least one coaxial cable may be disposed so as to be stacked with the first antenna module with respect to the direction perpendicular to the rear surface of the elec- (Continued)

tronic device and may be fixed to the bracket. Other various embodiments are possible.

15 Claims, 18 Drawing Sheets

(58) Field of Classification Search
CPC ......... H01R 2201/02; H01P 3/06; H04B 3/52; H04M 1/0277; H04M 1/0268
See application file for complete search history.

(56) References Cited

U.S. PATENT DOCUMENTS

| | | |
|---|---|---|
| 2015/0214602 A1 | 7/2015 | Hobson et al. |
| 2018/0241120 A1 | 8/2018 | Li |
| 2019/0173184 A1 | 6/2019 | Kim et al. |
| 2020/0036083 A1 | 1/2020 | Kim et al. |
| 2020/0153110 A1 | 5/2020 | Kim et al. |
| 2020/0161763 A1 | 5/2020 | Lee et al. |
| 2020/0194879 A1 | 6/2020 | Lim et al. |
| 2020/0267861 A1 | 8/2020 | Kim |
| 2020/0295450 A1 | 9/2020 | Park et al. |
| 2022/0094064 A1* | 3/2022 | Ramalingam ............ H01Q 1/38 |
| 2022/0336965 A1* | 10/2022 | Compton ............. H01Q 25/005 |

FOREIGN PATENT DOCUMENTS

| | | |
|---|---|---|
| KR | 10-2000-0005279 | 3/2000 |
| KR | 10-0400563 | 10/2003 |
| KR | 10-1305518 | 9/2013 |
| KR | 10-2014-0039637 | 4/2014 |
| KR | 10-2015-0033977 | 4/2015 |
| KR | 10-2019-0050137 | 5/2019 |
| KR | 10-2019-0066939 | 6/2019 |
| KR | 10-2019-0066940 | 6/2019 |
| KR | 10-2020-0012106 | 2/2020 |
| KR | 10-2020-0058153 | 5/2020 |
| KR | 10-2020-0073745 | 6/2020 |
| KR | 10-2020-0101791 | 8/2020 |

OTHER PUBLICATIONS

Written Opinion of the ISA for PCT/KR2021/010752, mailed Dec. 10, 2021, 6 pages.
Korean Office Action dated Aug. 6, 2024 for KR Application No. 10-2020-0111146.
Korean Notice of Patent Grant dated Apr. 1, 2025 for KR Application No. 10-2020-0111146.

* cited by examiner

ELECTRONIC DEVICE COMPRISING ANTENNA MODULE AND COAXIAL CABLE

CROSS-REFERENCE TO RELATED APPLICATIONS

This application is a continuation of International Application No. PCT/KR2021/010752, designating the United States, filed on Aug. 12, 2021, in the Korean Intellectual Property Receiving Office, and claiming priority to Korean Patent Application No. 10-2020-0111146 filed on Sep. 1, 2020, in the Korean Intellectual Property Office, the disclosures of all of which are hereby incorporated by reference herein in their entireties.

BACKGROUND

Field

Various embodiments relate to a stacked structure of an antenna module and/or a coaxial cable and an electronic device including the same.

Description of Related Art

Electronic devices include antenna modules that support wireless communication services (e.g., 3G, 4G, or 5G services) of various frequency bands. The electronic device generally uses a part of a metal housing of the electronic device, or a conductive pattern inside the electronic device, as an antenna, in order to support a 3G/4G communication scheme such as GSM or LTE. Also, the electronic device uses, as an antenna, a patch antenna module arranging a plurality of antenna patches in an array form, in order to support a 5G communication scheme using a relatively high frequency band.

Meanwhile, a processor (e.g., a communication processor (CP), which comprises processing circuitry) of the electronic device communicates with a base station and determines a communication scheme to be used in the electronic device. For example, a wireless communication circuit of the electronic device can communicate with the base station by using one or more of a 3G/4G communication scheme or a 5G communication scheme. The wireless communication circuit and/or a PCB equipped with the wireless communication circuit can be electrically connected to each antenna module in order to control each antenna module.

SUMMARY

Since electronic devices have a limited mounting space, an electrical connection structure (e.g., a coaxial cable and a flexible printed circuit board) for connecting antenna modules and processors (or wireless communication circuits) of various communication schemes supported by the electronic devices should be efficiently mounted.

In the prior art, owing to a space occupied by an electrical connection structure (e.g., a coaxial cable and a flexible printed circuit board) inside an electronic device, there is a problem in that the size and capacity of a battery is reduced or the size of the electronic device is increased.

Various example embodiments may overcome one or more of the above problems, for example by providing a stacked structure of a coaxial cable and/or an antenna module and an electronic device including the same.

An electronic device of an example embodiment may include a housing forming at least a portion of the exterior of the electronic device, a first printed circuit board (PCB) disposed in a first region formed by the housing, a second printed circuit board disposed in a second region formed by the housing, a first antenna module disposed adjacent, directly or indirectly, to the at least portion of the exterior in a third region formed by the housing, a bracket which fixes, directly or indirectly, the first antenna module to the housing, a flexible printed circuit board (FPCB) which electrically connects, directly or indirectly, the first printed circuit board and the first antenna module, and at least one coaxial cable which electrically connects, directly or indirectly, the first printed circuit board and the second printed circuit board. The at least one coaxial cable may be disposed so as to be stacked with the first antenna module with respect to a direction perpendicular to a rear surface of the electronic device, and be fixed to the bracket.

An electronic device of an example embodiment may include a housing including a front plate forming a front surface of the electronic device, a rear plate forming a rear surface of the electronic device, and a side member forming a side surface of the electronic device, a first printed circuit board (PCB) disposed in a first region formed by the housing, a second printed circuit board disposed in a second region formed by the housing, a first antenna module disposed adjacent, directly or indirectly, to the side member in a third region located between the first region and the second region, a bracket fixing the first antenna module to the housing, and at least one coaxial cable electrically connecting the first printed circuit board and the second printed circuit board. At least a portion of the at least one coaxial cable may be fixed between the first antenna module and the rear plate by the bracket and be disposed to be stacked with the first antenna module.

An electronic device of various example embodiments may stack and arrange coaxial cables on an antenna module, thereby efficiently using a mounting space in the electronic device and, in particular, maximizing or increasing a battery mounting space (e.g., battery capacity).

The electronic device of various example embodiments may fix the coaxial cable by using a bracket for fixing a first antenna module without using a separate member, thereby reducing a manufacturing cost and improving the assemblability of the coaxial cable.

In addition to this, various effects identified directly or indirectly through the present document may be provided.

BRIEF DESCRIPTION OF DRAWINGS

The above and other aspects, features and advantages of certain embodiments will be more apparent from the following detailed description, taken in conjunction with the accompanying drawings, in which.

In connection with the description of the drawings, the same or similar reference numerals may be used for the same or similar components.

DETAILED DESCRIPTION

Figure 1:
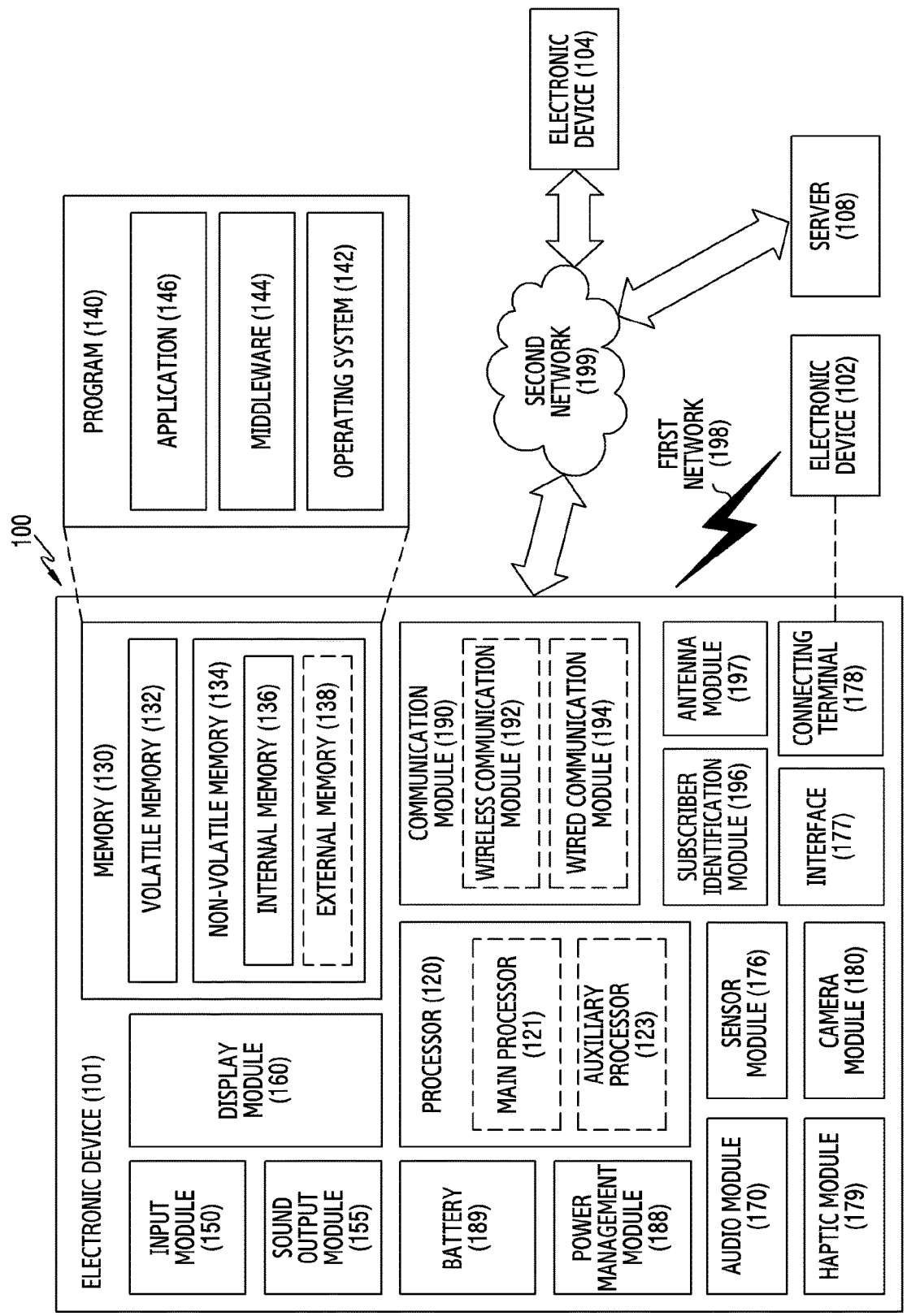
FIG. 1 is a block diagram of an electronic device in a network environment according to various example embodiments.

FIG. 1 is a block diagram of an electronic device in a network environment according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to and example embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121. Thus, each processor comprises processing circuitry.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to and example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on, directly or indirectly, a first surface (e.g., the bottom surface) of the printed circuit board, or adjacent to the first surface and capable of supporting a designated high-frequency band (e.g., the mmWave band), and a plurality of antennas (e.g., array antennas) disposed on, directly or indirectly, a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
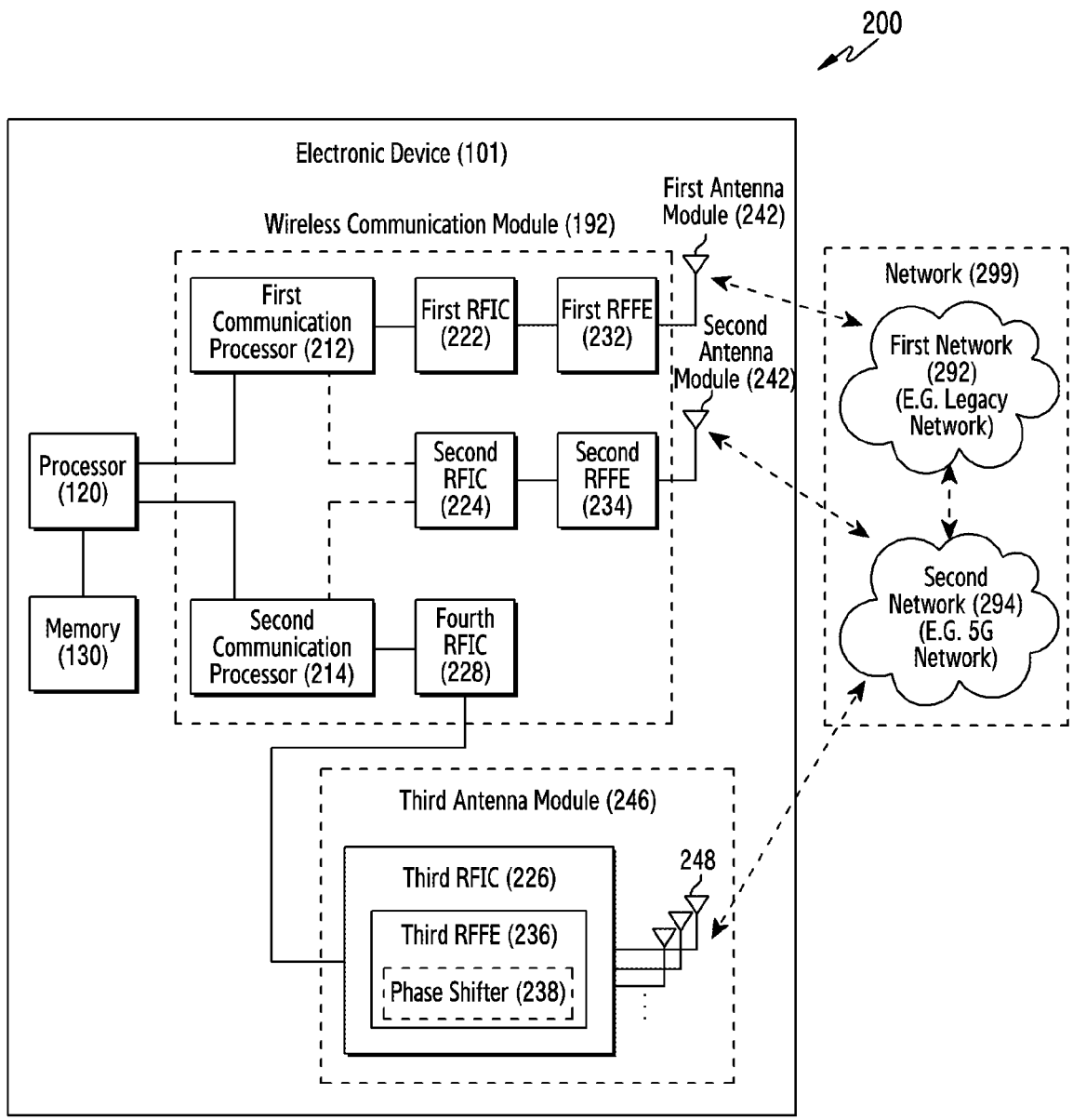
FIG. 2 is a block diagram of an electronic device in a network environment including a plurality of cellular networks according to various example embodiments.

FIG. 2 is a block diagram 200 of an electronic device in a network environment including a plurality of cellular networks, according to various embodiments.

Referring to FIG. 2, an electronic device 101 (eg, the electronic device 101 of FIG. 1) includes a first communication processor 212, a second communication processor 214, a first radio frequency integrated circuit (RFIC) (222), 2nd RFIC 224, 3rd RFIC 226, 4th RFIC 228, 1st radio frequency front end (RFFE) 232, 2nd RFFE 234, 1st antenna module 242, a second antenna module 244, and an antenna 248. The electronic device 101 may further include a processor 120 and a memory 130. The second network 199 may include a first cellular network 292 and a second cellular network 294. According to another embodiment, the electronic device 101 may further include at least one of the components shown in FIG. 1, and the second network 199 may further include at least one other network. According to an embodiment, a first communication processor 212, a second communication processor 214, a first RFIC 222, a second RFIC 224, a fourth RFIC 228, a first RFFE 232, and the second RFFE 234 may form at least a portion of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 establishes a communication channel corresponding to a designated band (eg, about 6 GHz to about 60 GHz) among bands to be used for wireless communication with the second cellular network 294, and establishes a 5G network through the established communication channel. communication can be supported. According to various embodiments, the second cellular network 294 may be a 5G network defined by 3GPP. Additionally, according to an embodiment, the first communication processor 212 or the second communication processor 214 corresponds to another designated band (eg, about 6 GHz or less) among bands to be used for wireless communication with the second cellular network 294. It is possible to support establishment of a communication channel to be established, and 5G network communication through the established communication channel. According to and example embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

According to and example embodiment, the first communication processor 212 and the second communication processor 214 are directly or indirectly connected to each other by an interface (not shown), and transmit data or control signals in either direction or both directions. can be provided or received.

The first RFIC 222, when transmitted, transmits a baseband signal generated by the first communication processor 212 to about 700 MHz to about 700 MHz used in the first cellular network 292 (eg, a legacy network). It can be converted into a radio frequency (RF) signal at 3 GHz. Upon reception, an RF signal is obtained from a first cellular network 292 (e.g., a legacy network) via an antenna (eg, the first antenna module 242) and transmits an RFFE (e.g., the first RFFE 232). It can be preprocessed through the first RFIC 222 may convert the preprocessed RF signal into a baseband signal to be processed by the first communication processor 212. When transmitting, the second RFIC 224 uses the baseband signal generated by the first communication processor 212 or the second communication processor 214 to the second cellular network 294 (e.g., a 5G network). It can be converted into an RF signal (hereinafter referred to as a 5G Sub6 RF signal) of a Sub6 band (e.g., about 6 GHz or less). Upon reception, a 5G Sub6 RF signal is obtained from a second cellular network 294 (e.g., a 5G network) through an antenna (eg, the second antenna module 244), and an RFFE (e.g., the second RFFE 234)) can be pretreated through. The second RFIC 224 may convert the preprocessed 5G Sub6 RF signal into a baseband signal to be processed by a corresponding communication processor among the first communication processor 212 and the second communication processor 214.

The third RFIC 226 transmits the baseband signal generated by the second communication processor 214 to the 5G Above6 band (e.g., about 6 GHz to about 60 GHz) to be used in the second cellular network 294 (e.g., a 5G network). It can be converted into an RF signal (hereinafter referred to as 5G Above6 RF signal). Upon reception, the 5G Above6 RF signal may be obtained from the second cellular network 294 (e.g., 5G network) via an antenna (e.g., antenna 248) and preprocessed via a third RFFE 236. The third RFIC 226 may convert the preprocessed 5G Above6 RF signal into a baseband signal to be processed by the second communication processor 214. According to and example embodiment, the third RFFE 236 may be formed as a part of the third RFIC 226.

The electronic device 101, according to an embodiment, may include a fourth RFIC 228 separately from or at least as part of the third RFIC 226. In this case, the fourth RFIC 228 converts the baseband signal generated by the second communication processor 214 into an RF signal (hereinafter, an IF signal) of an intermediate frequency band (e.g., about 9 GHz to about 11 GHz). After conversion, the IF signal may be transmitted to the third RFIC 226. The third RFIC 226 may convert the IF signal into a 5G Above6 RF signal. Upon reception, a 5G Above6 RF signal may be received from a second cellular network 294 (eg, a 5G network) via an antenna (e.g., antenna 248) and converted to an IF signal by a third RFIC 226. there is. The fourth RFIC 228 may convert the IF signal into a baseband signal so that the second communication processor 214 can process it.

According to an example, the first RFIC 222 and the second RFIC 224 may be implemented as a single chip or at least part of a single package. According to an embodiment, the first RFFE 232 and the second RFFE 234 may be implemented as a single chip or at least part of a single package. According to and example embodiment, at least one antenna module of the first antenna module 242 or the second antenna module 244 may be omitted or combined with another antenna module to process RF signals of a plurality of corresponding bands.

According to and example embodiment, the third RFIC 226 and the antenna 248 may be disposed on the same substrate to form the third antenna module 246. For example, the wireless communication module 192 or processor 120 may be disposed on a first substrate (e.g., main PCB). In this case, the third RFIC 226 is provided on a part (e.g., bottom surface) of the second substrate (e.g., sub PCB) separate from the first substrate, and the antenna 248 is placed on another part (e.g., top surface). is disposed, the third antenna module 246 may be formed. By arranging the third RFIC 226 and the antenna 248 on the same substrate, it is possible to reduce the length of the transmission line therebetween. This, for example, can reduce loss (e.g., attenuation) of a signal of a high frequency band (e.g., about 6 GHz to about 60 GHz) used for 5G network communication by a transmission line. As a result, the electronic device 101 can improve the quality or speed of communication with the second cellular network 294 (e.g., 5G network).

According to an embodiment, the antenna 248 may be formed of an antenna array including a plurality of antenna elements that may be used for beamforming. In this case, the third RFIC 226 may include, for example, a plurality of phase shifters 238 corresponding to a plurality of antenna elements as a part of the third RFFE 236. During transmission, each of the plurality of phase converters 238 may convert the phase of a 5G Above6 RF signal to be transmitted to the outside of the electronic device 101 (e.g., a base station of a 5G network) through a corresponding antenna element. During reception, each of the plurality of phase converters 238 may convert the phase of the 5G Above6 RF signal received from the outside through the corresponding antenna element into the same or substantially the same phase. This enables transmission or reception through beamforming between the electronic device 101 and the outside.

The second cellular network 294 (e.g., 5G network) may be operated independently (e.g., Stand-Alone (SA)) or connected to the first cellular network 292 (e.g., a legacy network) (example: Non-Stand Alone (NSA)). For example, a 5G network may include only an access network (e.g., a 5G radio access network (RAN) or a next generation RAN (NG RAN)) and no core network (e.g., a next generation core (NGC)). In this case, after accessing the access network of the 5G network, the electronic device 101 may access an external network (eg, the Internet) under the control of a core network (e.g., evolved packed core (EPC)) of the legacy network. Protocol information for communication with the legacy network (e.g., LTE protocol information) or protocol information for communication with the 5G network (e.g., New Radio (NR) protocol information) is stored in the memory 130, and other components (e.g., processor 120, the first communications processor 212, or the second communications processor 214).

Electronic devices according to various embodiments disclosed in this document may be devices of various types. The electronic device may include, for example, a portable communication device (e.g., a smart phone), a computer device, a portable multimedia device, a portable medical device, a camera, a wearable device, or a home appliance. An electronic device according to an embodiment of this document is not limited to the aforementioned devices.

Various embodiments of this document and terms used therein are not intended to limit the technical features described in this document to specific embodiments, and should be understood to include various modifications, equivalents, or substitutes of the embodiments. In connection with the description of the drawings, like reference numbers may be used for like or related elements. The singular form of a noun corresponding to an item may include one item or a plurality of items, unless the relevant context clearly dictates otherwise. In this document, "A or B", "at least one of A and B", "at least one of A or B", "A, B or C", "at least one of A, B and C", and "A Each of the phrases such as "at least one of, B, or C" may include any one of the items listed together in that phrase, or all possible combinations thereof. Terms such as "first", "second", or "first" or "secondary" may simply be used to distinguish a given component from other corresponding components, and may be used to refer to a given component in another aspect (eg, importance or order) is not limited. A (e.g., first) component is said to be "coupled" or "connected" to another (e.g., second) component, with or without the terms "functionally" or "communicatively." When mentioned, it indicates that the certain component may be connected to the other component directly (e.g., by wire), wirelessly, or through at least a third component(s).

The term "module" used in various embodiments of this document may include a unit implemented in hardware, software, or firmware, and is interchangeably interchangeable with terms such as, for example, logic, logic blocks, components, or circuits. can be used A module may be an integrally constructed component or a minimal unit of components or a portion thereof that performs one or more functions. For example, according to and example embodiment, the module may be implemented in the form of an application-specific integrated circuit (ASIC). Thus, each "module" herein may comprise circuitry.

Various embodiments of this document describe one or more instructions stored in a storage medium (e.g., internal memory 136 or external memory 138) readable by a machine (e.g., electronic device 101). It may be implemented as software (e.g., the program 140) including them. For example, a processor (e.g., the processor 120) of a device (e.g., the electronic device 101) may call at least one command among one or more instructions stored from a storage medium and execute it. This enables the device to be operated to perform at least one function according to the at least one command invoked. The one or more instructions may include code generated by a compiler or code executable by an interpreter. The device-readable storage medium may be provided in the form of a non-transitory storage medium. Here, 'non-temporary' only means that the storage medium is a tangible device and does not contain a signal (e.g., electromagnetic wave), and this term refers to the case where data is stored semi-permanently in the storage medium. It does not discriminate when it is temporarily stored.

According to and example embodiment, the method according to various embodiments disclosed in this document may be included and provided in a computer program product. Computer program products may be traded between sellers and buyers as commodities. A computer program product is distributed in the form of a device-readable storage medium (e.g., compact disc read only memory (CD-ROM)), or through an application store (e.g., Play Store™) or on two user devices (e.g., It can be distributed (e.g., downloaded or uploaded) online, directly between smart phones. In the case of online distribution, at least part of the computer program product may be temporarily stored or temporarily created in a device-readable storage medium such as a manufacturer's server, an application store server, or a relay server's memory.

According to various embodiments, each component (e.g., module or program) of the components described above may include a single object or a plurality of objects, and some of the multiple objects may be separately disposed in other components. According to various embodiments, one or more components or operations among the aforementioned components may be omitted, or one or more other components or operations may be added. Alternatively or additionally, a plurality of components (e.g., modules or programs) may be integrated into a single component. In this case, the integrated component may perform one or more functions of each of the plurality of components identically or similarly to those performed by a corresponding component of the plurality of components prior to the integration. According to various embodiments, operations performed by modules, programs, or other components are executed sequentially, in parallel, iteratively, or heuristically, or one or more of the operations are executed in a different order, omitted, or, or one or more other operations may be added.

Figure 3A:
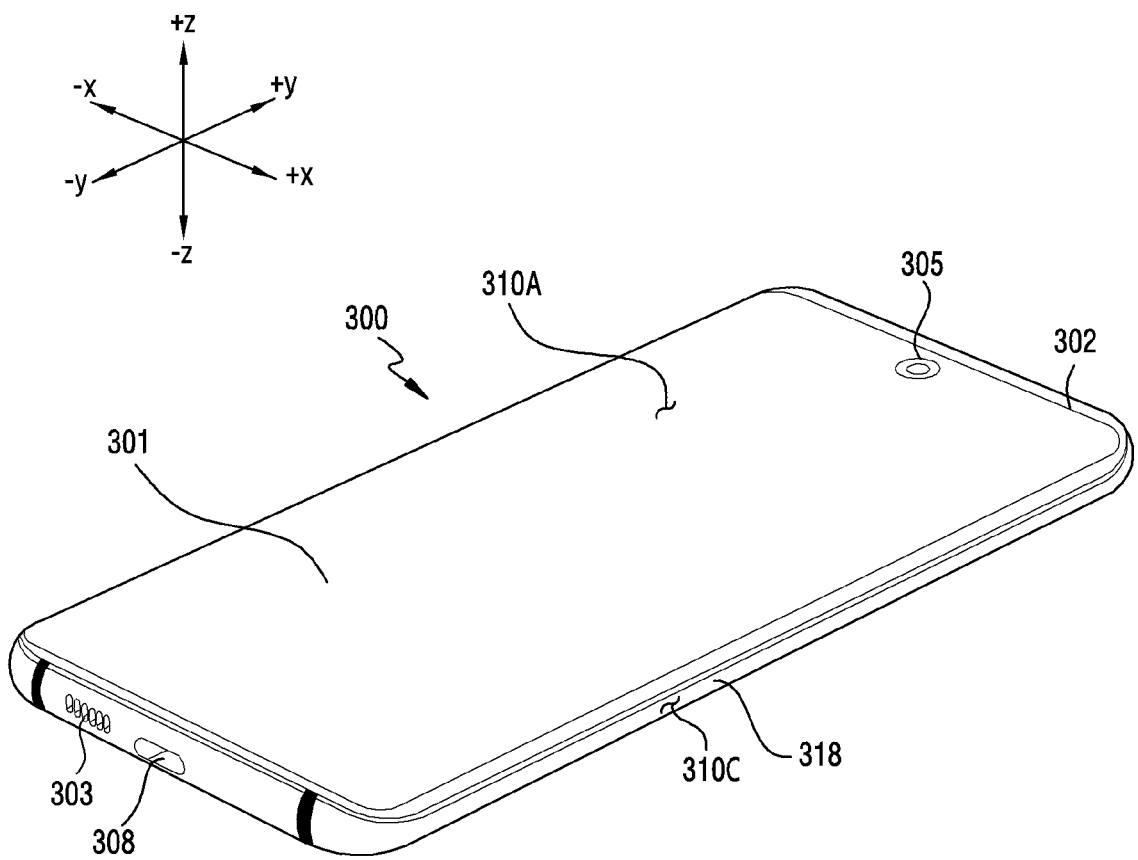
FIG. 3A is a perspective view illustrating a front surface of an electronic device according to an example embodiment.
Figure 3B:
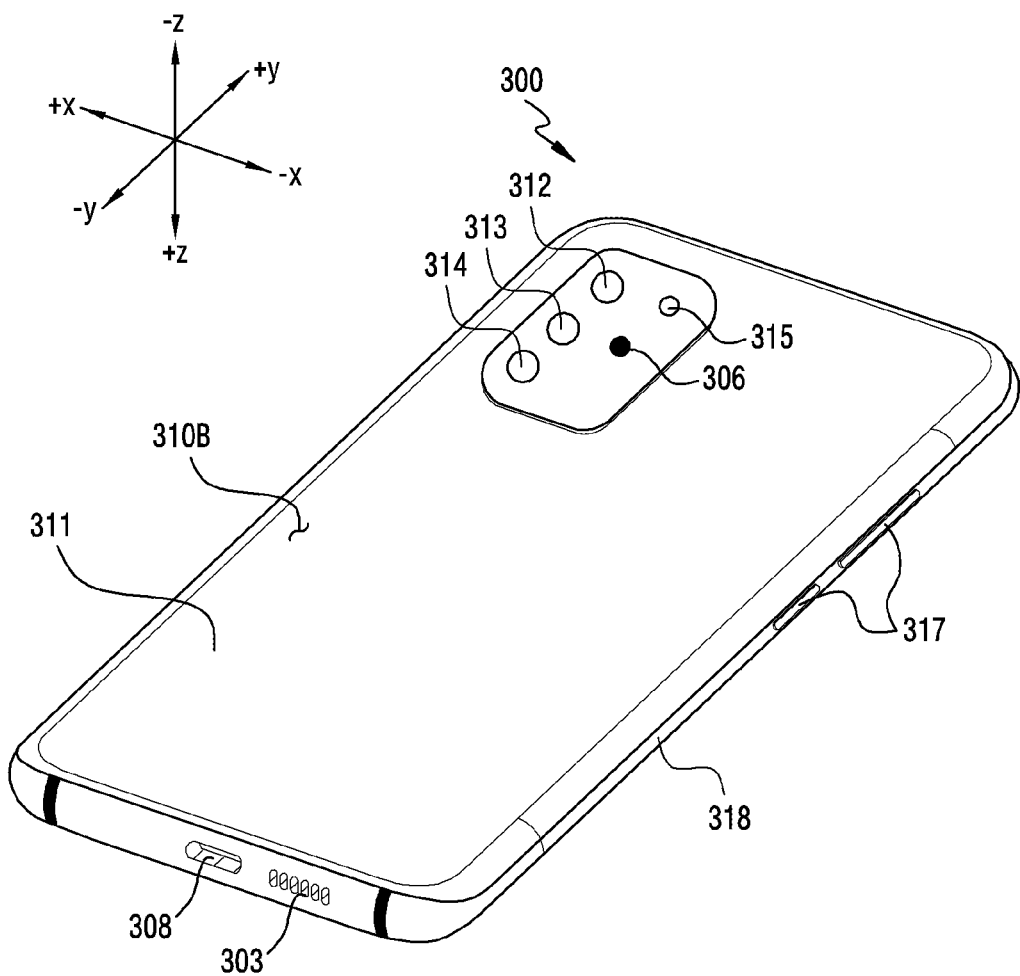
FIG. 3B is a perspective view illustrating a rear surface of the electronic device of FIG. 3A.

FIG. 3A is a perspective view illustrating a front surface of an electronic device 300 (e.g., the electronic device 101 of FIG. 1) according to an embodiment, and FIG. 3B is a perspective view illustrating a rear surface of the electronic device 300 of FIG. 3A.

Referring to FIG. 3A and FIG. 3B, the electronic device 300 of an embodiment may include a housing 310 including a first surface (or "front surface") 310A, a second surface (or "rear surface") 310B, and a side surface (or "side wall") 310C surrounding a space between the first surface 310A and the second surface 310B. In another embodiment (not shown), the housing 310 may refer to a structure forming some of the first surface 310A, the second surface 310B, and the side surface 310C of FIG. 3A and FIG. 3B.

According to an embodiment, the first surface 310A may be formed by a front plate 302 (e.g., a glass plate or a polymer plate including various coating layers) that is at least partially transparent. According to an embodiment, at least one side edge portion of the front plate 302 may include a curved portion that is bent from the first surface 310A toward a rear plate 311 and is extended seamlessly.

According to an embodiment, the second surface 310B may be formed by the substantially opaque rear plate 311. The rear plate 311 may, for example, be formed of coated or tinted glass, ceramic, polymer, metal (e.g., aluminum, stainless steel (STS), or magnesium), or a combination of at least two of the above materials. According to an embodiment, at least side edge portion of the rear plate 311 may include a curved portion that is bent from the second surface 310B toward the front plate 302 and is extended seamlessly.

According to an embodiment, the side surface 310C may be coupled to the front plate 302 and the rear plate 311, and be formed by a side member 318 including metal and/or polymer. In some embodiments, the rear plate 311 and the side member 318 may be integrally formed and include the same material (e.g., a metal material such as aluminum).

According to an embodiment, the electronic device 300 may include at least one of a display 301, an audio module 303, a sensor module (not shown), camera modules 305, 312, 313, and 306, a key input device 317, and a connector hole 308. In some embodiments, the electronic device 300 may omit at least one (e.g., the key input device 317) of the components or additionally include other components. In an example, the electronic device 300 may include a sensor module (not shown). For example, the sensor module may be disposed on a rear surface of a screen display region of the display 301 that is visible to the outside of the electronic device 300 through the front plate 302. For example, at least one of an optical sensor, an ultrasonic sensor, or a capacitive sensor may be disposed on the rear surface of the screen display region of the display 301, but is not limited thereto. In some embodiments, the electronic device 300 may further include a light emitting element, and the light emitting element may be disposed adjacent, directly or indirectly, to the display 301 within a region provided by the front plate 302. The light emitting element may provide, for example, state information of the electronic device 300 in the form of light. In another embodiment, the light emitting element may provide, for example, a light source interlocked with the operation of the camera module 305. The light emitting element may include, for example, an LED, an IR LED, and/or a xenon lamp.

According to an embodiment, the display 301 may be visible to the outside of the electronic device 300 through a significant portion of the front plate 302. In some embodiments, an edge of the display 301 may be formed substantially identical to an adjacent outer shape (e.g., a curved surface) of the front plate 302.

According to another embodiment (not shown), the electronic device 300 may form a recess, a notch, or an opening in a portion of the screen display region of the display 301, and various electronic components, for example, a camera module 305 or a sensor module (not shown) may be disposed in the recess, the notch, or the opening. According to another embodiment (not shown), at least one of a camera module (e.g., 312, 313, 314, 315), a fingerprint sensor, and a flash (e.g., 306) may be disposed on the rear surface of the screen display region of the display 301. According to another embodiment (not shown), the display 301 may be combined with, or be disposed adjacent to, directly or indirectly, a touch sensing circuit, a pressure sensor capable of measuring the intensity (pressure) of a touch, and/or a digitizer detecting a magnetic stylus pen.

According to an embodiment, the audio module 303 may include a microphone hole and a speaker hole. A microphone for acquiring external sound may be disposed inside the microphone hole, and in some embodiments, a plurality of microphones may be disposed to detect the direction of sound. According to another embodiment, the speaker hole and the microphone hole may be implemented as one hole, or a speaker may be included without the speaker hole (e.g., a piezo speaker). The speaker hole may include, for example, an external speaker hole and a receiver hole for communication.

The electronic device 300 may generate an electrical signal or data value corresponding to an internal operating state or an external environmental state by including a sensor module (not shown). The sensor module may include a proximity sensor disposed on the first surface 310A of the housing 310, a fingerprint sensor disposed on a rear surface of the display 301, and/or a biosensor (e.g., an HRM sensor) disposed on the second surface 310B of the housing 310. The sensor module may include, for example, at least one of a gesture sensor, a gyro sensor, an air pressure sensor, a magnetic sensor, an acceleration sensor, a grip sensor, a color sensor, an IR (infrared) sensor, a bio sensor, a temperature sensor, a humidity sensor, and an illuminance sensor.

The camera modules 305, 312, 313, 314, 315, and 306 may include a first camera device 305 disposed on the first surface 310A of the electronic device 300, second camera devices 312, 313, 314, 315 disposed on the second surface 310B, and/or the flash 306. The aforementioned camera devices 305, 312, 313, 314, and 315 may include one or a plurality of lenses, an image sensor, and/or an image signal processor. The flash 306 may include, for example, a light emitting diode or a xenon lamp. In some embodiments, two or more lenses (infrared camera, wide-angle and telephoto lenses) and image sensors may be disposed on one surface of the electronic device 300.

The key input device 317 may be disposed on the side surface 310C of the housing 310. In another embodiment, the electronic device 300 may not include some or all of the above-mentioned key input devices 317, and the key input devices 317 not included may be implemented in other forms such as soft keys on the display 301. In some embodiments, the key input device may include at least a portion of a fingerprint sensor disposed on the second surface 310B of the housing 310.

The connector hole 308 may accommodate a connector for transmitting and receiving power and/or data to and from an external electronic device, and/or a connector for transmitting and receiving an audio signal to and from the external electronic device. For example, the connector hole 308 may include a USB connector or an earphone jack. In an embodiment, the USB connector and the earphone jack may be implemented as a single hole (e.g., 308 of FIGS. 3A and 3B), and according to another embodiment (not shown), the electronic device 300 may transmit and receive power and/or data, or transmit and receive audio signals, with the external electronic device (e.g., the electronic devices 102 and 104 of FIG. 1) without a separate connector hole.

Figure 4:
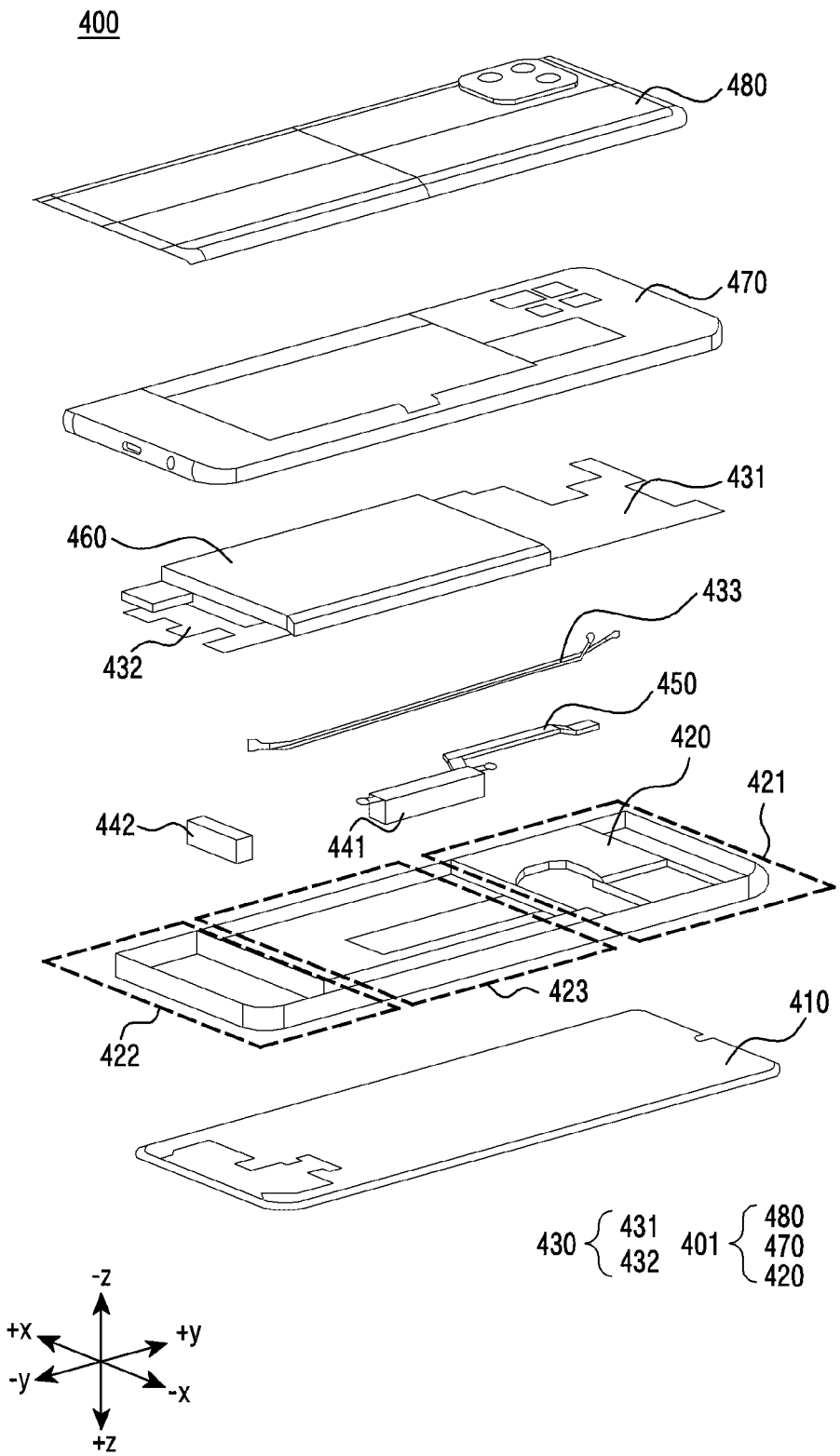
FIG. 4 is an exploded perspective view of an electronic device according to an example embodiment.

FIG. 4 is an exploded perspective view of an electronic device 400 (e.g., the electronic device 300 of FIGS. 3A and 3B) according to an embodiment.

Referring to FIG. 4, the electronic device 400 of an embodiment may include a housing 401 (e.g., the housing 310 of FIGS. 3A and 3B), a display 410 (e.g., the display 301 of FIG. 3A), at least one printed circuit board 430, a first antenna module 441, a second antenna module 442, and/or a battery 460, and the housing 401 may include a front case 420, a rear case 470 (e.g., the side member 318 of FIGS. 3A and 3B), and/or a rear cover 480. According to an embodiment, at least one of the components of the electronic device 400 is identical or similar to at least one of the components of the electronic device 101 of FIG. 1 and/or the electronic device 300 of FIGS. 3A and 3B, and duplicate descriptions will be omitted below.

According to an embodiment, the front case 420 may be formed of a metal material and/or a non-metal (e.g., polymer) material, to provide a space in which electronic components may be disposed within the electronic device 400. For example, the display 410 may be disposed on one surface (e.g., one surface of the +z direction of FIG. 4) of the front case 420, and the at least one printed circuit board 430 and/or the battery 460 may be disposed on the other surface (e.g., one surface of the −z direction of FIG. 4) of the front case 420.

According to an embodiment, the front case 420 may form a first region 421 adjacent to, directly or indirectly, an upper end (e.g., a region in the +y direction of FIG. 4) of the electronic device 400, a second region 422 adjacent to, directly or indirectly, a lower end (e.g., a region in the −y direction of FIG. 4) of the electronic device 400, and a third region 423 disposed between the first region 421 and the second region 422.

According to an embodiment, a plurality of electronic components may be disposed on the at least one printed circuit board 430. In an example, a processor (e.g., the processor 120 of FIG. 1), a memory (e.g., the memory 130 of FIG. 1), and/or an interface (e.g., the interface 177 of FIG. 1) may be disposed on the at least one printed circuit board 430. The processor may include, for example, at least one of a central processing unit, an application processor, a graphic processing unit, an image signal processor, a sensor hub processor, and a communication processor. The memory may include, for example, a volatile memory or a non-volatile memory. The interface may include, for example, a high definition multimedia interface (HDMI), a universal serial bus (USB) interface, an SD card interface, and/or an audio interface. The interface may electrically or physically connect the electronic device 400 with an external electronic device, and may include a USB connector, an SD card/MMC connector, or an audio connector.

According to an embodiment, the at least one printed circuit board 430 may include a first printed circuit board 431 and/or a second printed circuit board 432. In an example, the first printed circuit board 431 may be disposed in the first region 421 of the front case 420. In another example, the second printed circuit board 432 may be disposed in the second region 422 spaced apart from the first region 421 of the front case 420. However, the structure of the at least one printed circuit board 430 is not limited to the embodiment shown in FIG. 4, and according to another embodiment (not shown), the at least one printed circuit board 430 may also consist of or include one printed circuit board. According to an embodiment, the first printed circuit board 431 and the second printed circuit board 432 may be electrically connected through an electrical connection member. The aforementioned electrical connection member may be, for example, a coaxial cable 433. According to an embodiment, power and/or signals may be transmitted from the first printed circuit board 431 to the second printed circuit board 432 through the coaxial cable 433.

According to an embodiment, the first antenna module 441 may be disposed adjacent to, directly or indirectly, a side surface part (e.g., a region in the −x direction of FIG. 4) of the electronic device 400 in the third region 423 of the front case 420. However, a position where the first antenna module 441 is disposed is not limited thereto, and according to another embodiment, the first antenna module 441 may be disposed adjacent, directly or indirectly, to another side surface part (e.g., a region in the +x direction of FIG. 4) of the electronic device 400 in the third region 423. In an embodiment, the first antenna module 441 may be a mmWave antenna module for 5G network communication. In an embodiment, the first antenna module 202 may be configured to transmit or receive radio signals having a frequency of about 6 GHz to 100 GHz.

According to an embodiment, the second antenna module 442 may be disposed adjacent to, directly or indirectly, a lower end (e.g., a region in the −y direction of FIG. 4) of the electronic device 400 in the second region 422 of the front case 420. However, a position where the second antenna module 442 is disposed is not limited thereto, and the second antenna module 44 may be disposed adjacent to, directly or indirectly, the exterior of the electronic device 400 within the second region 422. In an embodiment, the second antenna module 442 may be an antenna module for legacy network communication. For example, a legacy network may include a second generation (2G), 3G, 4G, or long term evolution (LTE) network. According to an embodiment, frequency bands used for wireless communication of the first antenna module 441 and the second antenna module 442 may be different from each other.

According to an embodiment, the first printed circuit board 431 and the first antenna module 441 may be electrically connected through an electrical connection member. The aforementioned electrical connection member may be, for example, a flexible printed circuit board (FPCB) 450. According to an embodiment, power and/or signals may be transmitted from the first printed circuit board 431 to the first antenna module 441 through the flexible printed circuit board 450.

According to an embodiment, the battery 460 may be disposed in the third region 423 of the front case 420. According to an embodiment, the battery 460 may be disposed between the first printed circuit board 431 and the second printed circuit board 432, and the first printed circuit board 431 and the second printed circuit board 432, which are divided by the battery 460, may be electrically connected through the coaxial cable 433. In an embodiment, the battery 460 may provide power necessary for driving at least one electronic component (e.g., the first antenna module 441, the second antenna module 442, the processor, etc.) disposed in the electronic device 400. For example, the battery 460 may include a non-rechargeable primary cell, a rechargeable secondary cell, or a fuel cell. At least a portion of the battery 460 may be disposed substantially on the same plane as the printed circuit board 430, for example. According to the embodiment, the battery 460 may be integrally disposed inside the electronic device 400 or may be disposed detachably from the electronic device 400.

According to an embodiment, the rear case 470 may prevent or reduce the at least one printed circuit board 430 disposed in the electronic device 400 and/or a plurality of electronic components disposed on the at least one printed circuit board 430 from being damaged by external impact.

According to an embodiment, the rear case 470 may include a metal frame structure (not shown). In an example, the metal frame structure may be formed of a conductive material (e.g., metal), to form a side surface (e.g., the side surface 310C of FIG. 3A) of the electronic device 400. For example, the metal frame structure may include at least one conductive portion and/or at least one non-conductive portion insulating the at least one conductive portion. The at least one conductive portion of the aforementioned metal frame structure may operate as an antenna radiator for transmitting and/or receiving RF signals of a specified frequency band. In another example, at least one conductive pattern may be disposed on at least one region of the rear case 470. The at least one conductive pattern may operate as an antenna radiator for transmitting and/or receiving RF signals of a ultra-wide band (UWB) together with the first antenna module 441.

According to an embodiment, the rear cover 480 may form a rear surface (e.g., the second surface 310B of FIG. 3B) of the electronic device 400. According to an embodiment, the rear cover 480 may protect the internal components of the electronic device 400 from external impact or inflow of foreign substances.

Figure 5:
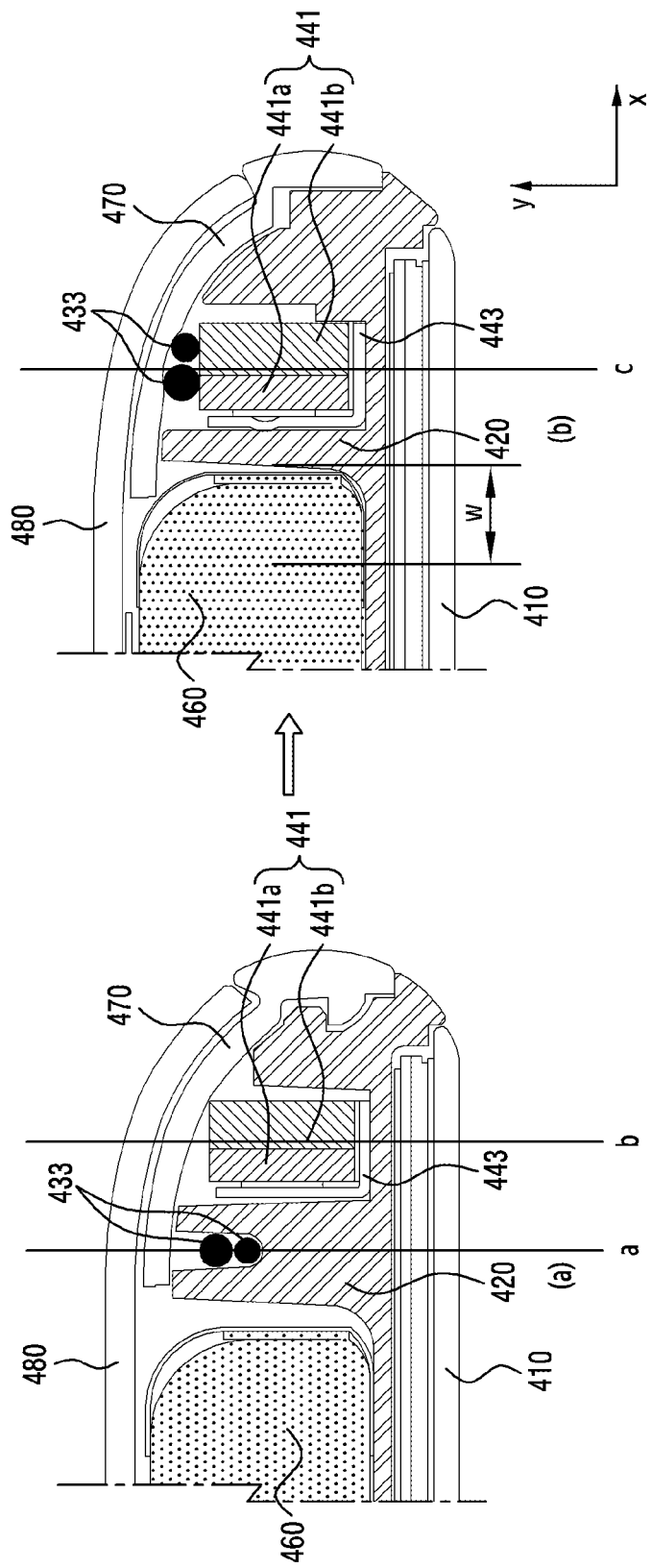
FIG. 5 is a diagram illustrating a cross section of a region in which a first antenna module of an electronic device is disposed according to an example embodiment.

FIG. 5 is a diagram illustrating a cross-section of a region where the first antenna module 441 of the electronic device 400 is disposed according to an embodiment. FIG. 5 (a) illustrates an arrangement structure of the first antenna module 441 and the plurality of coaxial cables 433 of a comparative embodiment, and FIG. 5 (b) illustrates an arrangement structure of the first antenna module 441 and the plurality of coaxial cables 433 of the present disclosure. However, the number of coaxial cables 433 is not limited to those shown in FIG. 5A and FIG. 5B, and the electronic device 400 may include only one coaxial cable 433 or may include three or more coaxial cables 433.

Referring to FIG. 5 (a), in the comparative embodiment, the coaxial cable 433 electrically connecting between a printed circuit board (e.g., the first printed circuit board 431) disposed in an upper region of the electronic device 400 and a printed circuit board (e.g., the second printed circuit board 432) disposed in a lower region of the electronic device 400 is disposed to pass between the battery 460 and the first antenna module 441. That is, in the comparative embodiment, an a-axis along which the coaxial cable 433 is aligned in the electronic device 400 is different from a b-axis along which the first antenna module 441 is aligned, and the a-axis and the b-axis are disposed parallel to an x direction. Accordingly, in the conventional electronic device 400, there is a problem in that a separate space for arranging the coaxial cable 433 between the battery 460 and the first antenna module 441 is required, and the size of the electronic device 400 (or the front case 420 of the electronic device 400) is increased or the size of the battery 460 is decreased.

Referring to FIG. 5 (b), in the present disclosure, the coaxial cable 433 electrically connecting between a printed circuit board (e.g., the first printed circuit board 431) disposed on an upper region of the electronic device 400 and a printed circuit board (e.g., the second printed circuit board 432) disposed on a lower region of the electronic device 400 may be disposed to be stacked with the first antenna module 441, with respect to a direction perpendicular to the rear surface of the electronic device 400. In an embodiment, the coaxial cable 433 may be aligned on the same c-axis as the first antenna module 441, and may be positioned adjacent to, directly or indirectly, one surface (e.g., lower surface) of the first antenna module 441. In an embodiment, the coaxial cable 433 may be disposed to pass through a space between the first antenna module 441 and the rear cover 480 (or the rear case 470). Accordingly, the electronic device 400 may additionally secure a marginal space (w) occupied by a path of the conventional coaxial cable 433, and may increase the capacity of the battery 460 or decrease the size of the electronic device 400 by using the secured space (w). A method of fixing so as not to move the coaxial cable 433 disposed to be stacked with the first antenna module 441 will be described later.

According to an embodiment, the electronic device 400 may include one coaxial cable 433 or two or more coaxial cables 433. The coaxial cable 433 may electrically connect the first printed circuit board 431 and the second printed circuit board 432, and may transmit and receive power and/or signals from electronic components disposed on the first printed circuit board 431 to electronic components disposed on the second printed circuit board 432. According to an embodiment, when the electronic device 400 includes two or more coaxial cables 433, the thickness of the respective coaxial cables 433 may be the same as or different from each other, and the amount of power or signal transmitted per unit time may be different depending on the thickness of the coaxial cables 433. The electronic device 400 of an embodiment may simultaneously process several signals by using the two or more coaxial cables 433.

According to an embodiment, the first antenna module 441 may be a mmWave antenna module for 5G network communication, and may include a radio frequency integrated circuit (RFIC) 441a, and a PCB 441b on which an antenna array is disposed. In another embodiment, at least one of the aforementioned components may be omitted, or at least two of the components may be integrally formed. According to an embodiment, the antenna array may be formed inside and/or on a surface of the first antenna module 441. In an embodiment, the antenna array may include various types of antenna arrays. For example, the antenna array may include a patch antenna array or a dipole antenna array.

According to an embodiment, the RFIC 441a may be configured to process an RF signal transmitted or received through the antenna array. For example, the RFIC 441a may, during transmission, convert an intermediate frequency (IF) signal or a baseband signal acquired from the wireless communication circuit 434, into an RF signal of a specified band. For another example, the RFIC 441a may, during reception, convert an RF signal acquired from the antenna array into an IF signal or a baseband signal, and provide the same to the wireless communication circuit 434.

According to an embodiment, the first antenna module 441 may receive power through the PCB 441b, and may provide power required for various parts, for example, the RFIC 441a of the first antenna module 441.

According to an embodiment, the electronic device 400 may include a bracket 443 fixing the first antenna module 441 to the housing 401 (e.g., the front case 420 or the rear case 470). In an embodiment, the first antenna module 441 may be fixed to the housing 401 of the electronic device 400 via the bracket 443.

Figure 6:
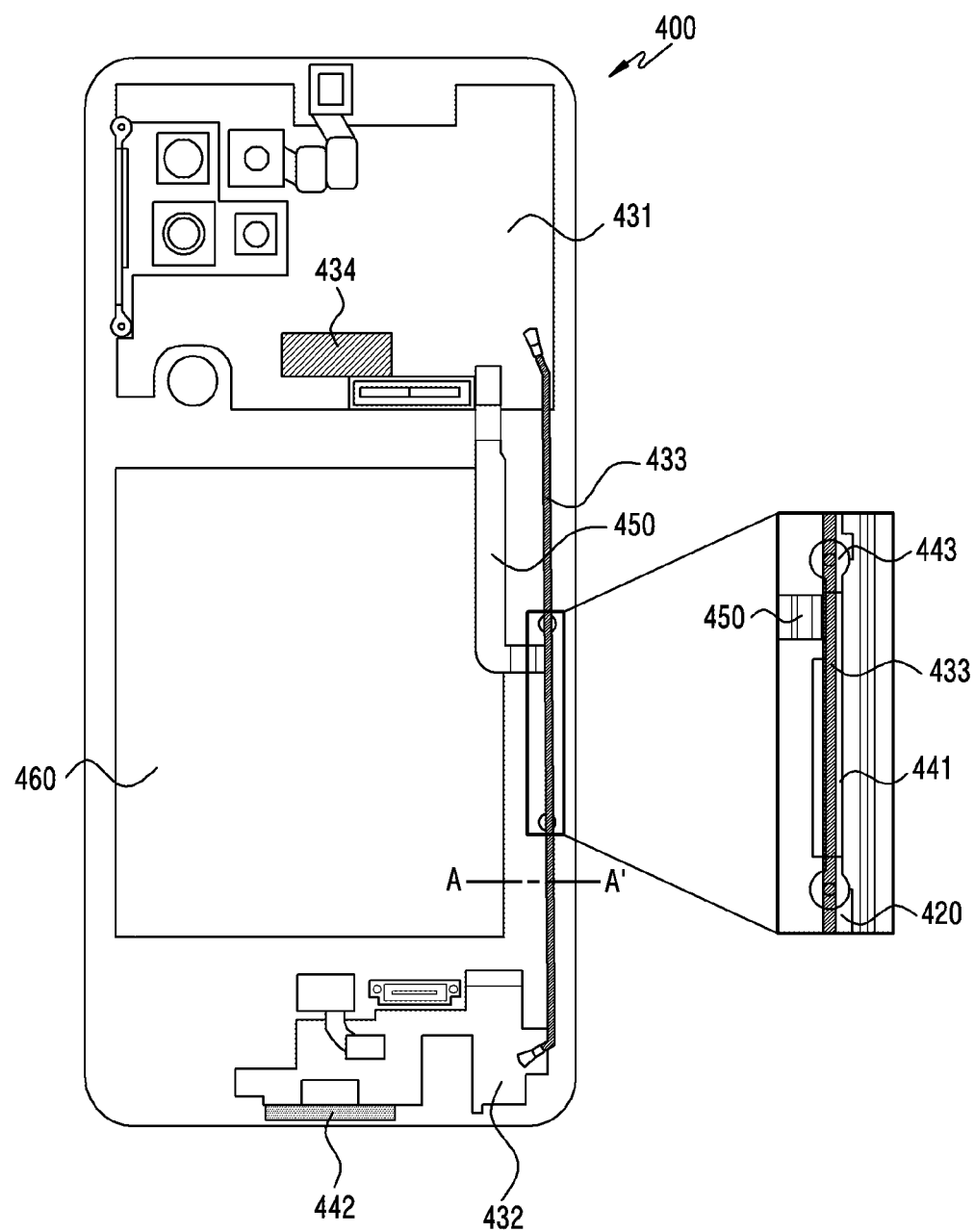
FIG. 6 is a diagram illustrating the inside of an electronic device according to an example embodiment.

FIG. 6 is a diagram illustrating the inside of the electronic device 400 according to an embodiment.

Referring to FIG. 6, the first printed circuit board 431 of an embodiment may be disposed in an upper region (e.g., the first region 421 of FIG. 4) of an inner space formed by the front case 420. According to an embodiment, the wireless communication circuit 434 (e.g., the wireless communication module 192 of FIG. 1), a connection part (not shown) for coupling with the flexible printed circuit board 450, a connection part (not shown) for coupling with the coaxial cable 433, and/or at least some (e.g., the processor 120 and the memory 130) of the components of FIG. 1 may be disposed on, directly or indirectly, the first printed circuit board 431.

According to an embodiment, the wireless communication circuit 434 may be disposed on, directly or indirectly, the first printed circuit board 431, to be electrically connected to the first printed circuit board 431 and be electrically connected to the at least one connection part disposed on the first printed circuit board 431. According to an embodiment, the wireless communication circuit 434 may be electrically connected to an antenna module (e.g., the first antenna module 441, the second antenna module 442) through the at least one connection part, the flexible printed circuit board 450, and/or the coaxial cable 433. For example, the wireless communication circuit 434 may be electrically connected to the first antenna module 441 through the flexible printed circuit board 450. For another example, the wireless communication circuit 434 may be electrically connected to the second antenna module 442 disposed on, directly or indirectly, the second printed circuit board 432 through the coaxial cable 433.

According to an embodiment, the wireless communication circuit 434 may be configured to transmit power or signals to the antenna module. In an embodiment, the wireless communication circuit 434 may be configured to transmit or receive radio frequency (RF) signals via the antenna module. According to an embodiment, the first antenna module 441 may be a mmWave antenna module for 5G network communication, and the wireless communication circuit 434 may transmit or receive RF signals of about 6 GHz to 100 GHz band through the first antenna module 441. According to an embodiment, the second antenna module 442 may be an antenna module for legacy network communication, and the wireless communication circuit 434 may transmit or receive RF signals of about 700 MHz to 6 GHz band through the first antenna module 441.

According to an embodiment, the first antenna module 441 (comprising an antenna) and the second antenna module 442 (comprising an antenna) may be disposed adjacent to, directly or indirectly, an edge of the housing 401 in a space formed by the housing 401. In an example, the first antenna module 441 may be disposed adjacent to, directly or indirectly, a side surface of the electronic device 400 in a middle region (e.g., the third region 423 of FIG. 4) of an internal space formed by the front case 420. According to an embodiment, the first antenna module 441 may be mounted on the bracket 443 and may be fixed to the housing 401 (or the front case 420) of the electronic device 400 by the bracket 443. In an example, the second antenna module 442 may be disposed adjacent to, directly or indirectly, a rear surface of the electronic device 400 in a lower region (e.g., the second region 422 of FIG. 4) of the inner space formed by the front case 420. However, positions where the first antenna module 441 and the second antenna module 442 are disposed are not limited to those shown in FIG. 6, and may be disposed adjacent to, directly or indirectly, the edge of the housing 401 in various positions. According to another embodiment, the electronic device 400 may further include an antenna module in addition to the first antenna module 441 and the second antenna module 442.

According to an embodiment, the flexible printed circuit board 450 may be disposed to electrically connect the first printed circuit board 431 and the first antenna module 441 across an empty space under the battery 460. In an embodiment, the flexible printed circuit board 450 may be disposed between the battery 460 and the rear cover 480, and may forward power and signals transmitted by the wireless communication circuit 434 disposed on, directly or indirectly, the first printed circuit board 431, to the first antenna module 441. In an embodiment, a signal acquired through the first antenna module 441 may be forwarded to the wireless communication circuit 434 through the flexible printed circuit board 450.

According to an embodiment, the coaxial cable 433 may be disposed to electrically connect the first printed circuit board 431 and the second printed circuit board 432 (and the second antenna module 442) across a side space of the battery 460. That is, the coaxial cable 433 may be disposed so as not to pass through a region occupied by the battery 460 within the electronic device 400, and may be disposed between the first antenna module 441 and the rear cover 480. According to an embodiment, the coaxial cable 433 may forward power and signals transmitted by the first printed circuit board 431, to the second printed circuit board 432, and may forward power and signals transmitted by the wireless communication circuit 434 disposed on, directly or indirectly, the first printed circuit board 431, to the second antenna module 442 disposed on, directly or indirectly, the second printed circuit board 432. In an embodiment, a signal acquired through the second antenna module 442 may be forwarded to the wireless communication circuit 434 through the coaxial cable 433.

Figure 7:
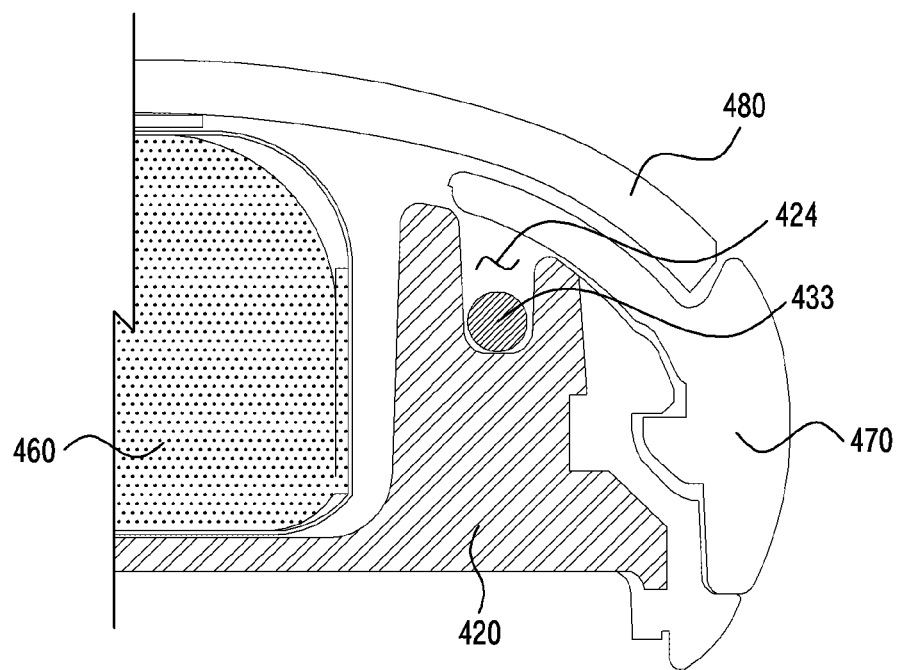
FIG. 7 is a cross-sectional view of the electronic device of FIG. 6 taken in a direction of A-A' according to an example embodiment.

FIG. 7 is a cross-sectional view of the electronic device 400 of FIG. 6 taken in a direction of A-A' according to an embodiment.

Referring to FIG. 7, the coaxial cable 433 electrically connecting the first printed circuit board 431 and the second printed circuit board 432 may be disposed to pass through a space between the battery 460 and the rear case 470 (or the side surface of the housing 401). According to an embodiment, a groove 424 in which the coaxial cable 433 is disposed may be formed in the front case 420. By disposing the coaxial cable 433 in the groove 424, the coaxial cable 433 may be fixed to prevent or reduce the likelihood of the coaxial cable 433 from moving inside the electronic device 400.

Hereinafter, the structure of the bracket 443 for fixing the coaxial cable 433 will be described.

Figure 8A:
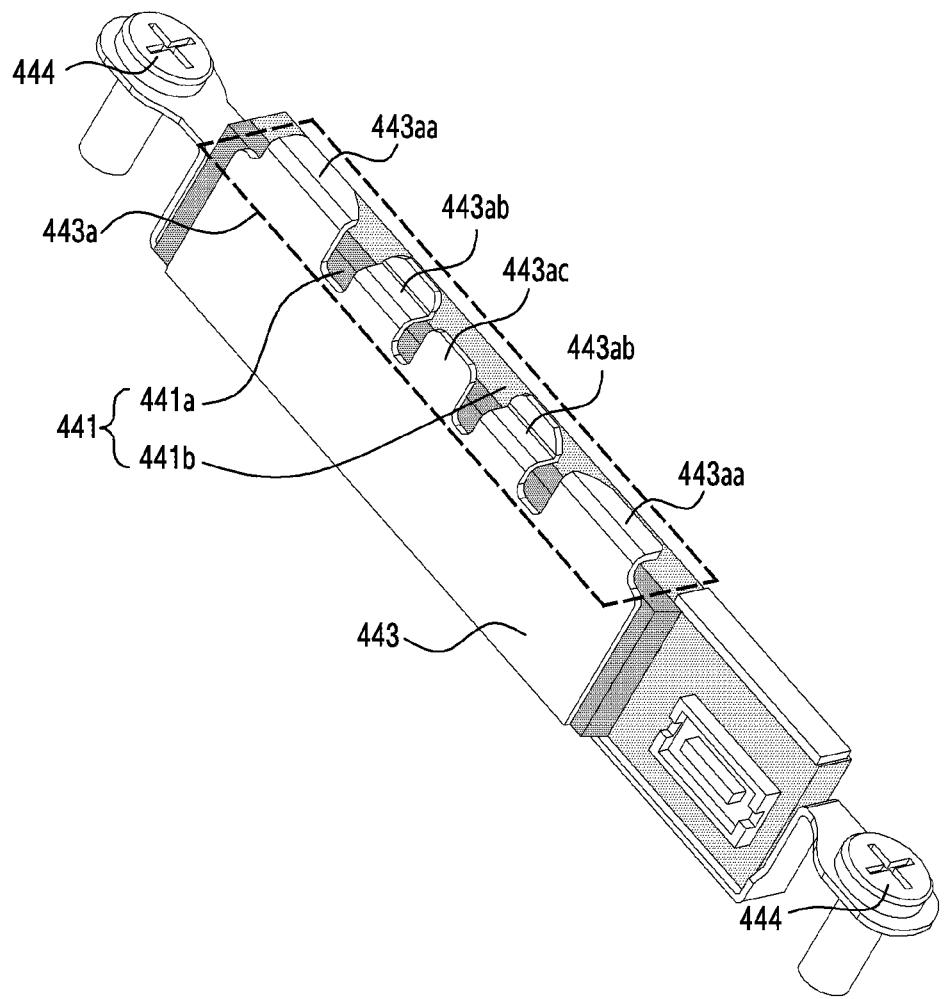
FIG. 8A is a diagram illustrating a first antenna module and a bracket according to an example embodiment.
Figure 8B:
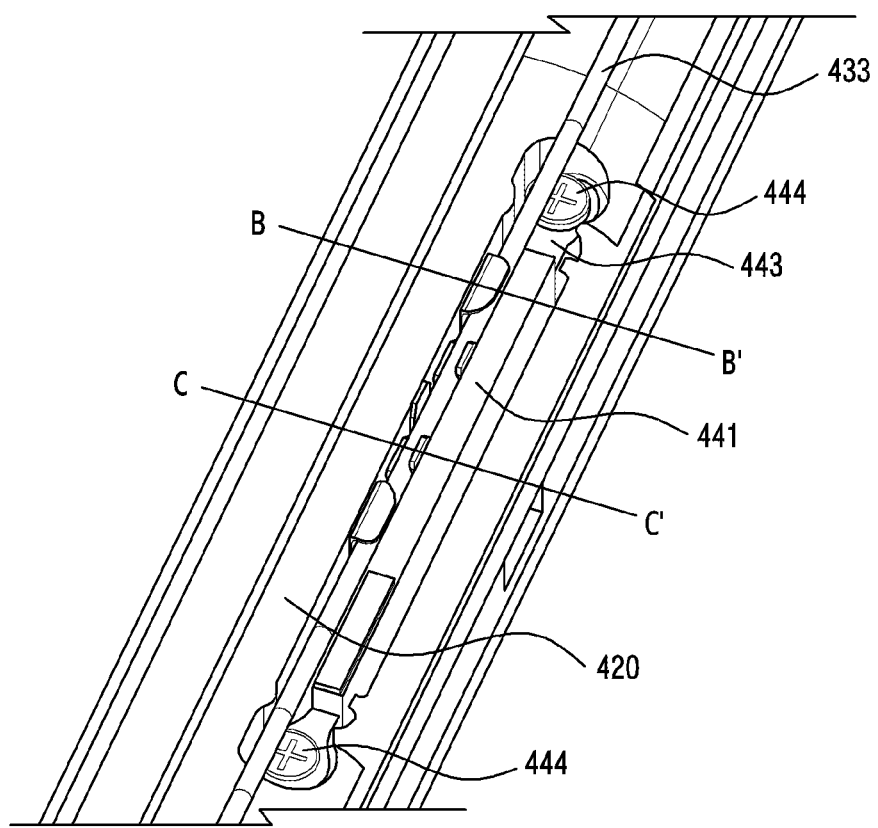
FIG. 8B is a diagram illustrating a state in which a first antenna module and a bracket are disposed in an electronic device according to an example embodiment.

FIG. 8A is a diagram illustrating the first antenna module 441 and the bracket 443 according to an embodiment, and FIG. 8B is a diagram illustrating a state in which the first antenna module 441 and the bracket 443 are disposed in the electronic device 400 according to an embodiment.

Referring to FIG. 8A and FIG. 8B, the first antenna module 441 may include the RFIC 441a and the PCB 441b, and may be mounted on the bracket 443. According to an embodiment, the size and shape of the bracket 443 may be formed to correspond to the size and shape of the first antenna module 441, and the bracket 443 may wrap at least one surface of the first antenna module 441. According to an embodiment, the bracket 443 may form a space for disposing the first antenna module 441, and holes (through-holes) for disposing screws 444 may be formed at both ends of the bracket 443. According to an embodiment, the first antenna module 441 may be fixed to the front case 420, by fixing the bracket 443 to the front case 420 in a state where the first antenna module 441 is disposed in the space formed by the bracket 443. In this case, the bracket 443 may be fixed to the front case 420 by inserting and tightening the screws 444 into the holes of the both ends of the bracket 443.

According to an embodiment, the bracket 443 may further include a structure 443a for fixing the coaxial cable 433. According to an embodiment, the structure 443a for fixing the coaxial cable 433 may wrap at least a portion of the coaxial cable 433, and may be formed wherein the direction of wraping the coaxial cable 433 is continuously changed. For example, the structure 443a for fixing the coaxial cable 433 may include at least one member 443aa wrapping the coaxial cable 433 in a 'Γ' shape, at least one member 443ab wrapping the coaxial cable 433 in a '⌐' shape, and at least one member 443ac disposed adjacent to the coaxial cable 433 in an 'I' shape. According to an embodiment, the at least one member 443ac disposed adjacent to the coaxial cable 433 in the 'I' shape may be constructed to contact with at least one surface of the coaxial cable 433. However, in the structure 443a for fixing the coaxial cable 433, the number, shape, and order of the at least one member 443aa wrapping the coaxial cable 433 in the 'Γ' shape, the at least one member 443ab wrapping the coaxial cable 433 in the '⌐' shape, and the at least one member 443ac disposed adjacent to the coaxial cable 433 in the 'I' shape are not limited to those shown in FIG. 8A and FIG. 8B.

Figure 9A:
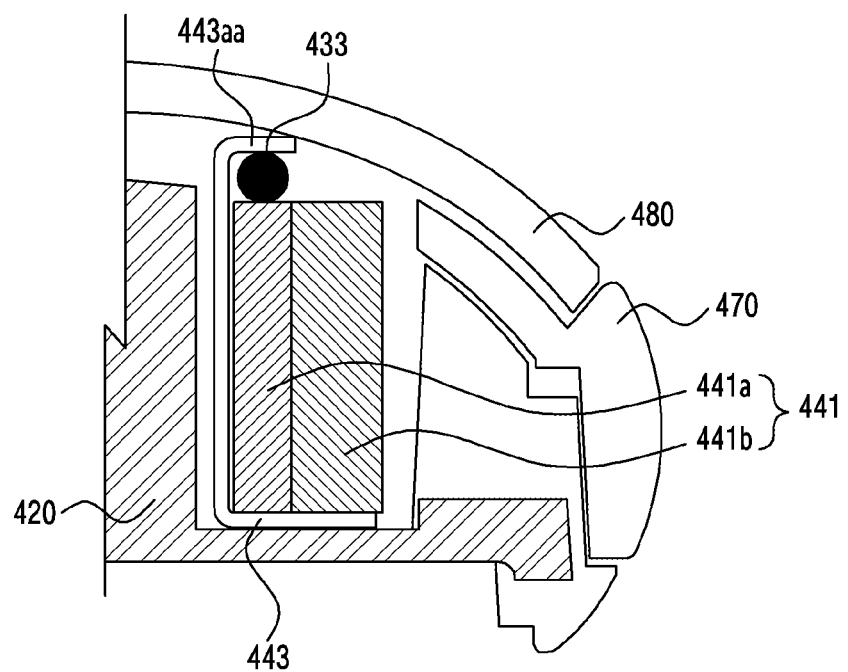
FIG. 9A is a cross-sectional view of the electronic device of FIG. 8B taken in a direction of B-B' according to an example embodiment.
Figure 9B:
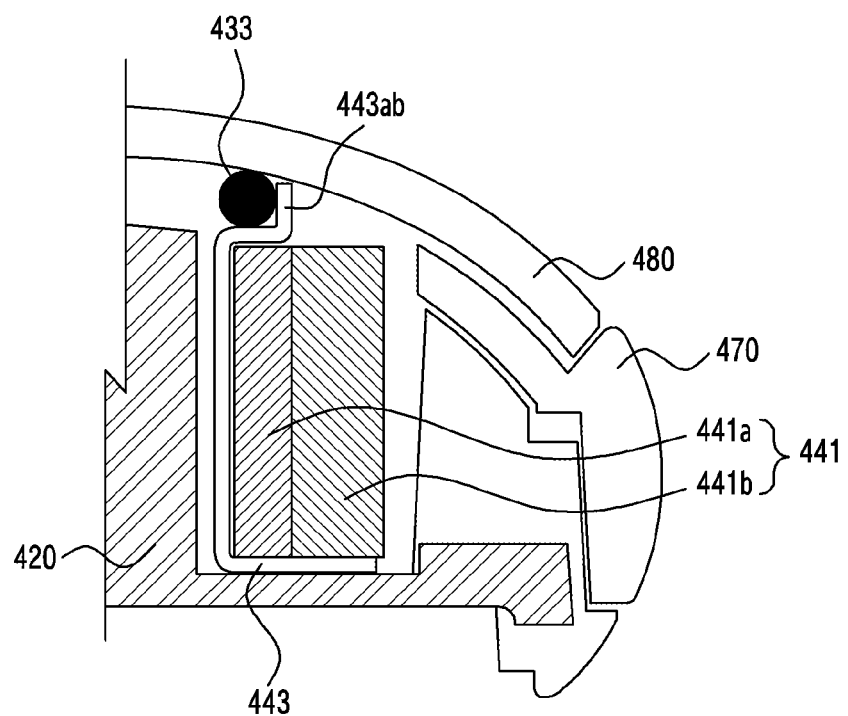
FIG. 9B is a cross-sectional view of the electronic device of FIG. 8B taken in a direction of C-C' according to an example embodiment.

FIG. 9A is a cross-sectional view of the electronic device 400 of FIG. 8B taken in a direction of B-B' according to an embodiment, and FIG. 9B is a cross-sectional view of the electronic device 400 of FIG. 8B taken in a direction of C-C' according to an embodiment.

Referring to FIG. 9A, the at least one member 443aa wrapping the coaxial cable 433 in the 'Γ' shape may be constructed to, while forming an angle (approximately 90 degrees), cover a surface (e.g., a surface adjacent to the rear cover 480) opposite to a surface whose coaxial cable 433 comes into contact with the first antenna module 441 and one side surface of the coaxial cable 433 connected thereto. However, the shape of the at least one member 443*aa* wrapping the coaxial cable 433 in the 'Γ' shape is not limited to that shown in FIG. 9A, and may be constructed as a flexible curved surface without forming an angle.

Referring to FIG. 9B, the at least one member 443*ab* wrapping the coaxial cable 433 in the '⌐' shape may be constructed to, while forming an angle (approximately 90 degrees), cover a surface whose coaxial cable 433 comes in contact with the first antenna module 441 and one side surface of the coaxial cable 433 connected thereto. However, the shape of the at least one member 443*ab* wrapping the coaxial cable 433 in the '⌐' shape is not limited to that shown in FIG. 9B, and may be also constructed as a flexible curved surface without forming an angle. The at least one member 443*ab* wrapping the coaxial cable 433 in the '⌐' shape and the at least one member 443*aa* wrapping the coaxial cable 433 in the 'Γ' shape may fix the side surfaces of the coaxial cable 433 (e.g., both side surfaces of the coaxial cable 433) different from each other.

Figure 10A:
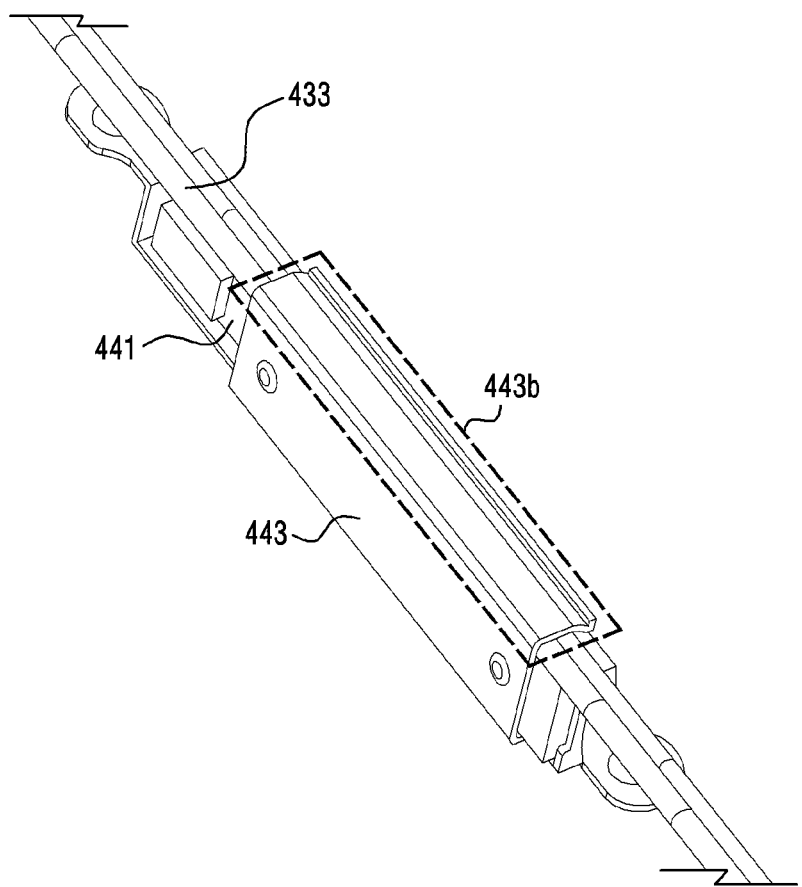
FIG. 10A is a diagram illustrating a first antenna module and a bracket according to an example embodiment.
Figure 10B:
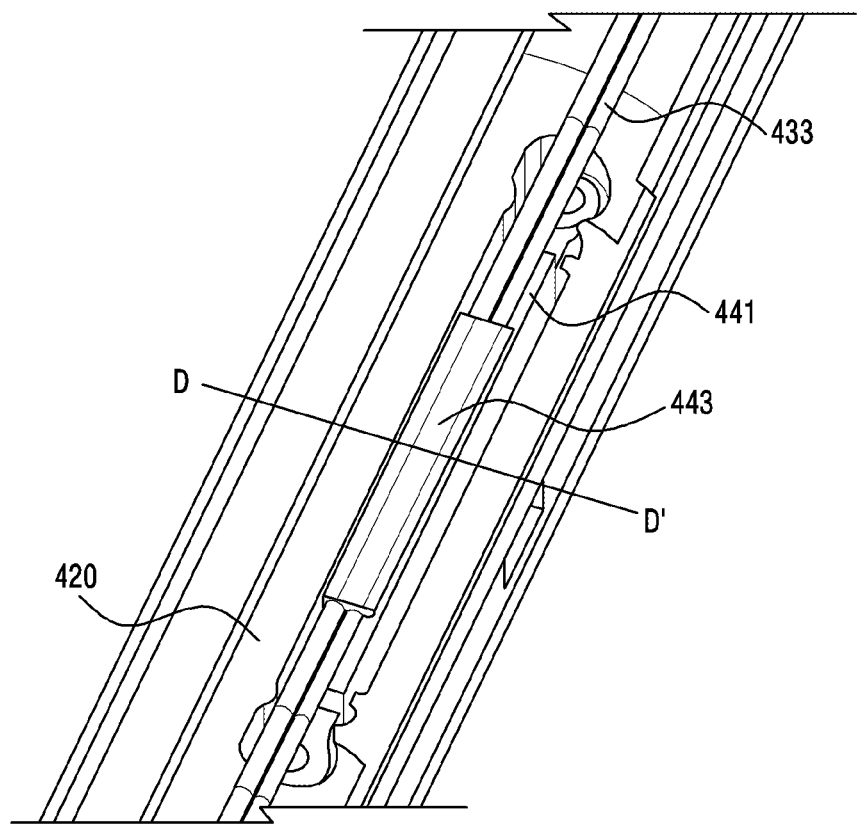
FIG. 10B is a diagram illustrating a state in which a first antenna module and a bracket are disposed in an electronic device according to an example embodiment.

FIG. 10A is a diagram illustrating the first antenna module 441 and the bracket 443 according to an embodiment, and FIG. 10B is a diagram illustrating a state in which the first antenna module 441 and the bracket 443 are disposed in the electronic device 400 according to an embodiment.

In FIG. 10A and FIG. 10B, portions overlapping with those described in FIGS. 8A and 8B are omitted.

Referring to FIG. 10A and FIG. 10B, the size and shape of the bracket 443 may be formed to correspond to the size and shape of the first antenna module 441, and the bracket 443 may wrap at least one surface of the first antenna module 441. According to an embodiment, the first antenna module 441 may be fixed to the front case 420, by fixing the bracket 443 to the front case 420 in a state where the first antenna module 441 is disposed in the space formed by the bracket 443.

According to an embodiment, the bracket 443 may further include a structure 443*b* for fixing the coaxial cable 433. According to an embodiment, the structure 443*b* for fixing the coaxial cable 433 may wrap at least a portion of the coaxial cable 433, and may be constructed by coupling a long plate shape member. For example, the structure 443*b* for fixing the coaxial cable 433 may cover the coaxial cable 433 in the 'Γ' shape, and in particular, may be constructed to cover a surface opposite to a surface whose coaxial cable 433 comes into contact with the first antenna module 441. However, the shape of the structure 443*b* for fixing the coaxial cable 433 is not limited to those shown in FIG. 10A and FIG. 10B, and may be formed to correspond to the size and/or number of the coaxial cable 433 wrapped by the structure 443*b* for fixing the coaxial cable 433.

Figure 11:
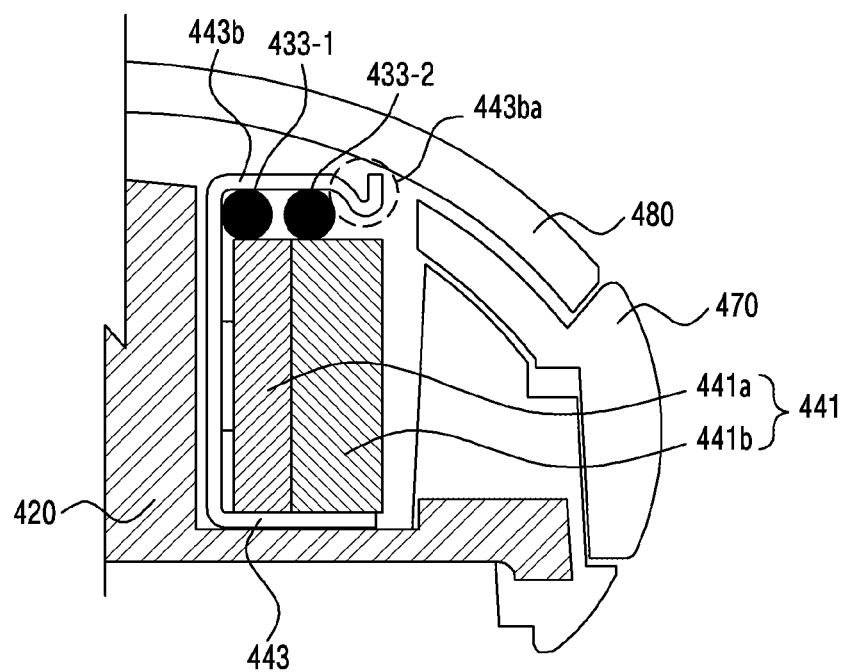
FIG. 11 is a cross-sectional view of the electronic device of FIG. 10B taken in a direction of D-D' according to an embodiment.

FIG. 11 is a cross-sectional view of the electronic device 400 of FIG. 10B taken in a direction of D-D' according to an embodiment.

Referring to FIG. 11, in a state where the first antenna module 441 is mounted on the bracket 443, an empty space for disposing coaxial cables 433-1 and 433-2 in a lower region of the first antenna module 441 adjacent to the rear cover 480 may be formed. That is, a space formed by the bracket 443 so as to dispose the first antenna module 441 may be larger than the size of the first antenna module 441, and the empty space may be formed between the structure 443*b* for fixing the coaxial cables 433-1 and 433-2 of the bracket 443 and the first antenna module 441. The coaxial cables 433-1 and 433-2 may pass through the formed empty space. According to an embodiment, the structure 443*b* for fixing the coaxial cables 433-1 and 433-2 may be constructed to, while forming an angle (about 90 degrees), cover a surface (e.g., a surface adjacent to the rear cover 480) opposite to a surface whose coaxial cables 433-1 and 433-2 come in contact with the first antenna module 441 and one side surface of the coaxial cables 433-1 and 433-2 connected thereto. However, the shape of the structure 443*b* for fixing the coaxial cables 433-1 and 433-2 is not limited to that shown in FIG. 11, and may be also constructed as a flexible curved surface without forming an angle.

According to an embodiment, one end 443*ba* of the structure 443*b* for fixing the coaxial cables 433-1 and 433-2 may be formed in a bent shape wherein the coaxial cables 433-1 and 433-2 may be fixed without being separated within the empty space. That is, the one end 443*ba* of the structure 443*b* for fixing the coaxial cables 433-1 and 433-2 may be constructed as a curved surface, and a cross-sectional area of the empty space be adjusted to correspond to the area of the coaxial cables 433-1 and 433-2 disposed inside the empty space. However, the shape of the one end 443*ba* of the structure 443*b* for fixing the coaxial cables 433-1 and 433-2 is not limited to that shown in FIG. 11, and may be constructed as curved surfaces of various shapes.

Figure 12:
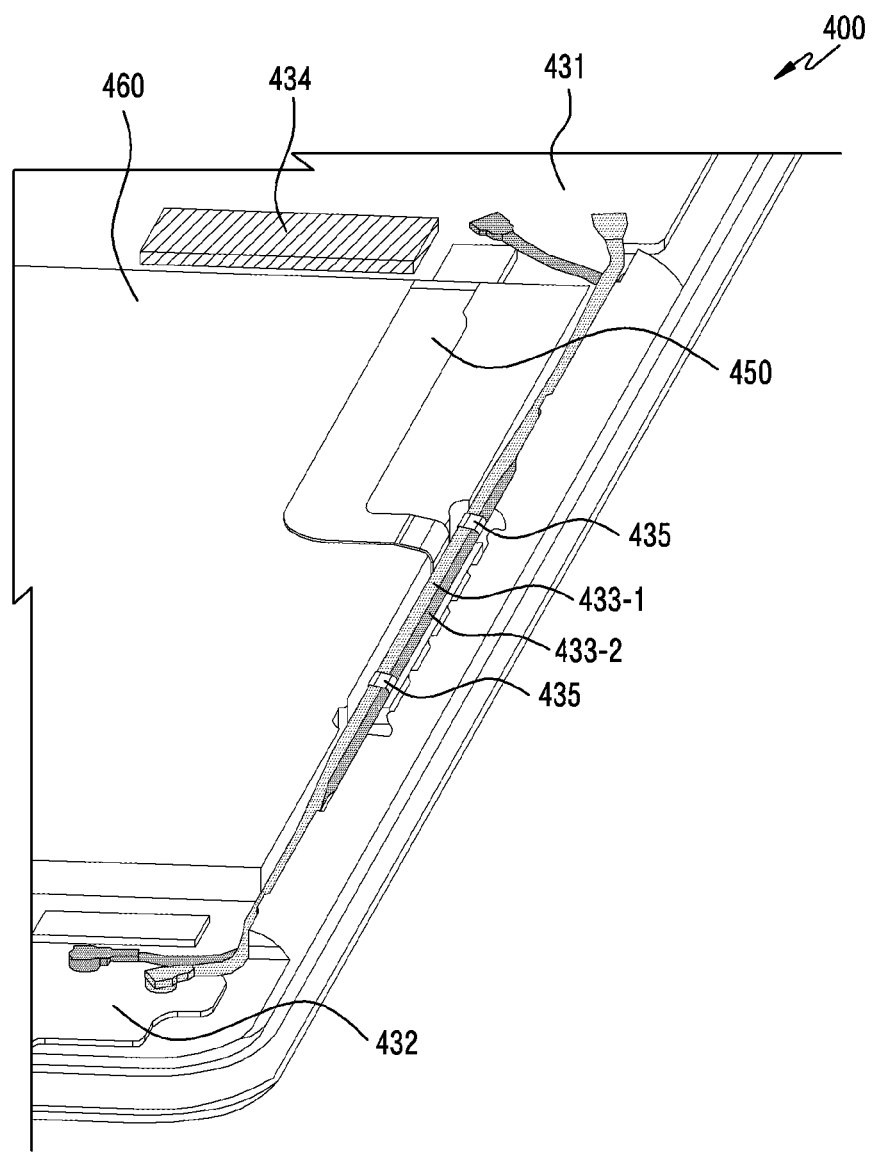
FIG. 12 is a diagram illustrating a state in which coaxial cables are bundled with cable ties and disposed inside an electronic device according to an example embodiment.

FIG. 12 is a diagram illustrating a state in which the coaxial cables 433-1 and 433-2 are bundled with cable ties 435 and are disposed inside the electronic device 400 according to an embodiment.

Referring to FIG. 12, the coaxial cables 433-1 and 433-2 electrically connecting the first printed circuit board 431 and the second printed circuit board 432 may pass adjacent to the side surface of the electronic device 400, and may be disposed to be stacked with the first antenna module 441, with respect to a direction perpendicular to the rear surface of the electronic device 400.

According to an embodiment, the coaxial cables 433-1 and 433-2 disposed stacked with the first antenna module 441 may be fixed by at least one cable tie 435. According to an embodiment, the at least one cable tie 435 may fix the coaxial cables 433-1 and 433-2 to the bracket 443 while bundling the coaxial cables 433-1 and 433-2, and may prevent or reduce a likelihood of the coaxial cables 433-1 and 433-2 from being lifted or moved in the electronic device 400. As shown in FIG. 12, the above-described cable tie 435 may be applied to the electronic device 400 as an independent embodiment, and may be also additionally applied to the embodiments described in FIG. 8 to FIG. 11. Hereinafter, the cable tie 435 will be described in detail with reference to FIG. 13 and FIG. 14.

Figure 13:
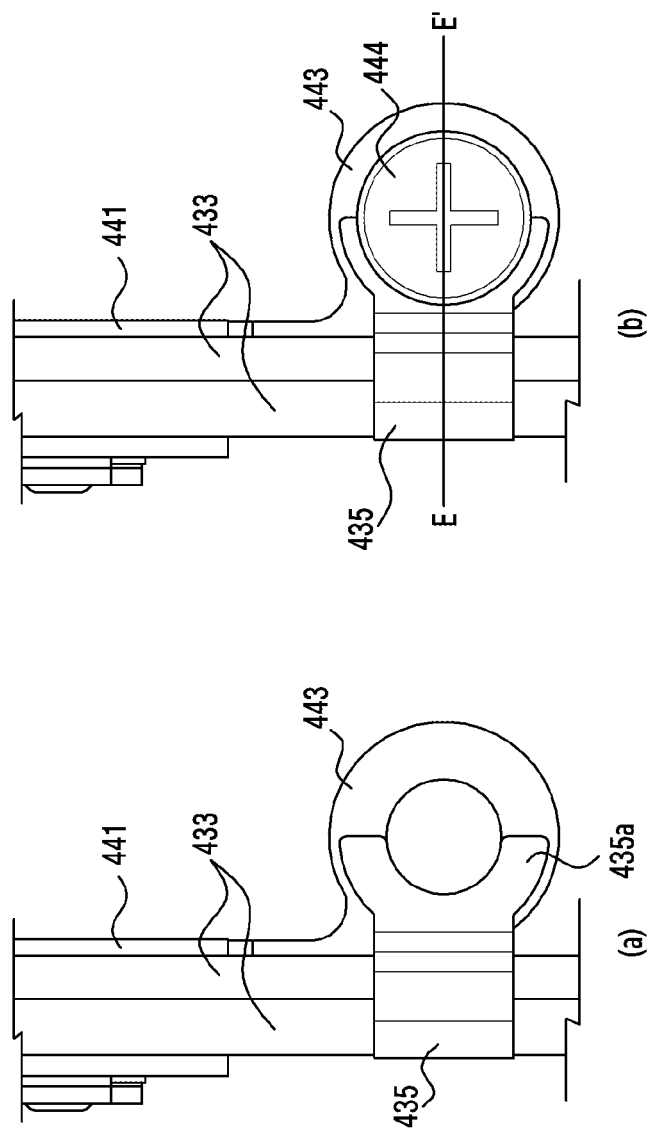
FIG. 13 is a diagram illustrating a method of fixing a cable tie to a bracket by using screws according to an example embodiment.

FIG. 13 is a diagram illustrating a method of fixing the cable tie 435 to the bracket 443 by using the screw 444 according to an embodiment. FIG. 13 (*a*) illustrates a state before the cable tie 435 is fixed by the screw 444, and FIG. 13 (*b*) illustrates a state after the cable tie 435 is fixed by the screw 444.

Referring to FIG. 13, a distal end 435*a* of the cable tie 435 wrapping the coaxial cable 433 may be fixed to the bracket 443 by the screw 444. According to an embodiment, the distal end 435*a* of the cable tie 435 may be formed to correspond to the shape of a hole included in the bracket 443, and at least a portion of the distal end 435*a* of the cable tie 435 may be fixed to the bracket 443 by the screw 444. That is, when the screw 444 is inserted into the hole included in the bracket 443 and tightened, the at least portion of the distal end 435*a* of the cable tie 435 may be fixed while being sandwiched between the bracket 443 and the screw 444.

According to an embodiment, the cable tie 435 may be made of gold (Au), and the screw 444 and the bracket 443 may be made of a metal material.

Figure 14:
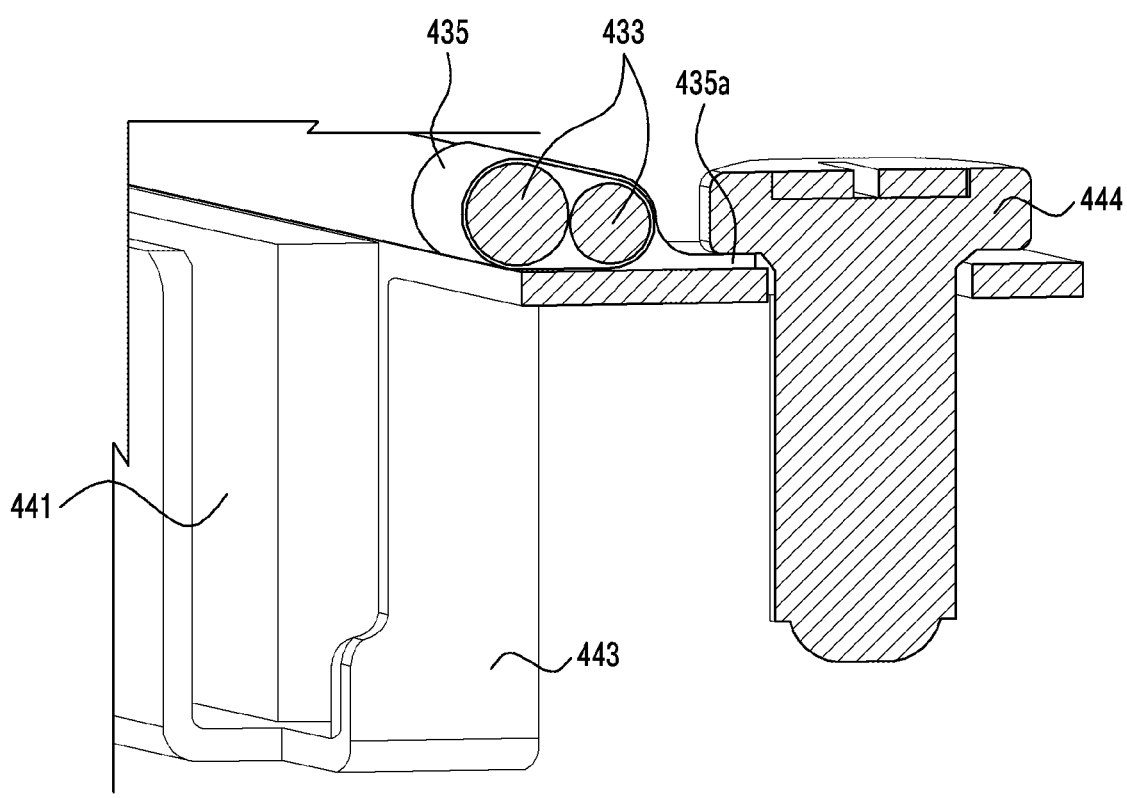
FIG. 14 is a cross-sectional view of the bracket, the coaxial cable, the cable tie, and the screw of FIG. 13 (*b*) taken in a direction of E-E' according to an example embodiment.

FIG. 14 is a cross-sectional view of the bracket 443, the coaxial cable 433, the cable tie 435, and the screw 444 taken in a direction of E-E' in FIG. 13 (*b*) according to an embodiment.

Referring to FIG. 14, the coaxial cable 433 disposed adjacent to the first antenna module 441 (comprising at least one antenna) may be fixed to, directly or indirectly, the bracket 443 by the screw 444 while being bundled with the cable tie 435. According to an embodiment, the cable tie 435 may bind the coaxial cable 433 tightly (e.g., not loosely) wherein the coaxial cable 433 does not move, and the diameter (or size) of the cable tie 435 may be determined by the diameter and/or number of coaxial cables 433. Referring to FIG. 14, at least a portion of the distal end 435*a* of the cable tie 435 may be fastened and fixed by the screw 444 between the bracket 443 and the screw 444.

As described above, an electronic device (e.g., the electronic device 100 of FIG. 1, the electronic device 300 of FIG. 3, and the electronic device 400 of FIG. 4) of an embodiment may include a housing forming at least a portion of the exterior of the electronic device, a first printed circuit board (PCB) disposed in a first region formed by the housing, a second printed circuit board disposed in a second region formed by the housing, a first antenna module disposed adjacent to the at least portion of the exterior in a third region formed by the housing, a bracket which fixes, directly or indirectly, the first antenna module to the housing, a flexible printed circuit board (FPCB) which electrically connects, directly or indirectly, the first printed circuit board and the first antenna module, and at least one coaxial cable which electrically connects, directly or indirectly, the first printed circuit board and the second printed circuit board. The at least one coaxial cable may be disposed so as to be stacked with the first antenna module with respect to a direction perpendicular to a rear surface of the electronic device, and be fixed, directly or indirectly, to the bracket.

According to an embodiment, the bracket may fix the at least one coaxial cable while wrapping at least a portion of the at least one coaxial cable.

According to an embodiment, the electronic device may further include at least one cable tie, and the at least one cable tie may bind the at least one coaxial cable, to fix the at least one coaxial cable.

According to an embodiment, the electronic device may further include at least one screw which fixes, directly or indirectly, the bracket to the housing, and an end of the at least one cable tie may be fixed to the bracket by the at least one screw.

According to an embodiment, the at least one cable tie may be made of gold (Au), and the at least one screw and the bracket may be made of a metal material.

According to an embodiment, the electronic device may further include a battery disposed in the third region, and the at least one coaxial cable may be disposed in a region different from the region in which the battery is disposed.

According to an embodiment, the housing may include a front plate forming a front surface of the electronic device, a rear cover forming a rear surface of the electronic device, and a side member forming a side surface of the electronic device. The at least one coaxial cable may be disposed to pass through an empty space formed between the first antenna module and the rear plate.

According to an embodiment, the first antenna module may be a mmWave antenna module for 5G network communication.

According to an embodiment, the electronic device may further include a second antenna module disposed adjacent to the at least portion of the exterior in the second region or forming the at least portion of the exterior, and a wireless communication circuit disposed on, directly or indirectly, the first printed circuit board. The wireless communication circuit may transmit and receive a radio frequency (RF) signal through the first antenna module or the second antenna module.

According to an embodiment, the wireless communication circuit may be electrically connected to the first antenna module through the flexible printed circuit board, and may be electrically connected to the second antenna module through the at least one coaxial cable.

According to an embodiment, the wireless communication circuit may transmit power or a signal to the first antenna module through the flexible printed circuit board, and may transmit power or a signal to the second antenna module through the at least one coaxial cable.

According to an embodiment, the wireless communication circuit may receive an RF signal having a frequency of 6 GHz to 100 GHz from the first antenna module through the flexible printed circuit board.

According to an embodiment, the second antenna module may be electrically connected to the second printed circuit board, and the at least one coaxial cable may electrically connect the first printed circuit board and the second antenna module.

As described above, an electronic device (e.g., the electronic device 100 of FIG. 1, the electronic device 300 of FIG. 3, and the electronic device 400 of FIG. 4) of an embodiment may include a housing including a front plate forming a front surface of the electronic device, a rear plate forming a rear surface of the electronic device, and a side member forming a side surface of the electronic device, a first printed circuit board (PCB) disposed in a first region formed by the housing, a second printed circuit board disposed in a second region formed by the housing, a first antenna module disposed adjacent to the side member in a third region located between the first region and the second region, a bracket fixing the first antenna module to the housing, and at least one coaxial cable electrically connecting the first printed circuit board and the second printed circuit board. At least a portion of the at least one coaxial cable may be fixed between the first antenna module and the rear plate by the bracket and be disposed to be stacked with the first antenna module. Each "antenna module" herein comprises at least one antenna.

According to an embodiment, the first antenna module may be an antenna module for 5G network communication transmitting and receiving a signal of 6 GHz to 100 GHz.

According to an embodiment, the electronic device may further include at least one cable tie, and at least one screw which fixes, directly or indirectly, the bracket to the housing. The at least one cable tie may bind the at least one coaxial cable, to fix the at least one coaxial cable, and an end of the at least one cable tie may be fixed to the bracket by the at least one screw.

According to an embodiment, the electronic device may further include a second antenna module disposed adjacent to the side member in the second region or forming a portion of the side member, and a flexible printed circuit board electrically connecting the first printed circuit board and the first antenna module.

According to an embodiment, the electronic device may further include a battery disposed in the third region, and the at least one coaxial cable may be disposed in a region different from the region in which the battery is disposed. According to an embodiment, the electronic device may further include a wireless communication circuit disposed on, directly or indirectly, the first printed circuit board. The wireless communication circuit may transmit and receive a radio frequency (RF) signal through the first antenna module or the second antenna module.

According to an embodiment, the wireless communication circuit may be electrically connected to the first antenna module through the flexible printed circuit board and be electrically connected to the second antenna module through the at least one coaxial cable, and may transmit power or a signal to the first antenna module through the flexible printed circuit board and transmit power or a signal to the second antenna module through the at least one coaxial cable.

In the specific example embodiments described above, components included in the disclosure are expressed in singular or plural numbers according to the specific embodiments presented. However, the expression of singular or plural is appropriately selected for the presented context for convenience of description, and the present disclosure is not limited to the singular or plural components, and even components expressed in the plural number may be constructed in the singular number, or even components expressed in the singular number may be constructed in the plural number.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising:
a housing forming at least a portion of the exterior of the electronic device;
a first printed circuit board (PCB) disposed in a first region at least partially formed by the housing;
a second printed circuit board disposed in a second region at least partially formed by the housing;
a first antenna module, comprising an antenna, disposed adjacent to the at least portion of the exterior in a third region at least partially formed by the housing;
a bracket which fixes the first antenna module to the housing;
a flexible printed circuit board (FPCB) which electrically connects at least the first printed circuit board and the first antenna module; and
at least one coaxial cable which electrically connects at least the first printed circuit board and the second printed circuit board,
wherein the at least one coaxial cable:
is disposed so as to be stacked with the first antenna module with respect to a direction perpendicular to a rear surface of the electronic device; and
is fixed to the bracket.

2. The electronic device of claim 1, wherein the bracket fixes the at least one coaxial cable while wrapping at least a portion of the at least one coaxial cable.

3. The electronic device of claim 1, further comprising at least one cable tie,
wherein the at least one cable tie binds the at least one coaxial cable, to fix the at least one coaxial cable.

4. The electronic device of claim 3, further comprising at least one screw which fixes the bracket to the housing,
wherein an end of the at least one cable tie is fixed to the bracket by the at least one screw.

5. The electronic device of claim 4, wherein the at least one cable tie comprises gold (Au), and the at least one screw and the bracket comprise metal.

6. The electronic device of claim 1, further comprising a battery at least partially disposed in the third region,
wherein the at least one coaxial cable is disposed in a region different from the region in which the battery is disposed.

7. The electronic device of claim 1, wherein the housing comprises:
a front plate forming at least part of a front surface of the electronic device;
a rear cover forming at least part of a rear surface of the electronic device; and
a side member forming at least part of a side surface of the electronic device,
wherein the at least one coaxial cable is disposed to pass through an empty space formed between at least the first antenna module and the rear plate.

8. The electronic device of claim 1, wherein the first antenna module is a mmWave antenna module for 5G network communication.

9. The electronic device of claim 1, further comprising:
a second antenna module, comprising an antenna, disposed adjacent to the at least portion of the exterior in the second region and/or forming the at least portion of the exterior; and
a wireless communication circuit disposed on the first printed circuit board,
wherein the wireless communication circuit is configured to transmit and/or receive a radio frequency (RF) signal through at least one of the first antenna module or the second antenna module.

10. The electronic device of claim 9, wherein the wireless communication circuit:
is electrically connected to the first antenna module through at least the flexible printed circuit board; and
is electrically connected to the second antenna module through at least the at least one coaxial cable.

11. The electronic device of claim 9, wherein the wireless communication circuit is configured to:
transmit at least one of power or a signal to the first antenna module through at least the flexible printed circuit board; and
transmit at least one of power or a signal to the second antenna module through at least the at least one coaxial cable.

12. The electronic device of claim 9, wherein the wireless communication circuit is configured to receive an RF signal having a frequency of 6 GHz to 100 GHz from the first antenna module through at least the flexible printed circuit board.

13. The electronic device of claim 9, wherein the second antenna module is electrically connected to the second printed circuit board, and the at least one coaxial cable electrically connects at least the first printed circuit board and the second antenna module.

14. An electronic device comprising:
a housing comprising a front plate forming at least part of a front surface of the electronic device, a rear plate forming at least part of a rear surface of the electronic device, and a side member forming at least part of a side surface of the electronic device;
a first printed circuit board (PCB) disposed in a first region at least partially formed by the housing;
a second printed circuit board disposed in a second region at least partially formed by the housing;
a first antenna module, comprising an antenna, disposed adjacent to the side member in a third region located between at least the first region and the second region;
a bracket fixing the first antenna module to the housing; and
at least one coaxial cable electrically connecting at least the first printed circuit board and the second printed circuit board,
wherein at least a portion of the at least one coaxial cable is fixed between at least the first antenna module and the rear plate by at least the bracket and is disposed to be stacked with the first antenna module.

15. The electronic device of claim 14, further comprising:
a second antenna module, comprising an antenna, disposed adjacent to the side member in the second region and/or forming a portion of the side member;
a flexible printed circuit board electrically connecting at least the first printed circuit board and the first antenna module; and
a battery disposed in the third region,
wherein the at least one coaxial cable is disposed in a region different from the region in which the battery is disposed.

* * * * *